United States Patent
Yamashita

(10) Patent No.: US 9,520,344 B2
(45) Date of Patent: Dec. 13, 2016

(54) SEMICONDUCTOR MODULE FOR ELECTRIC POWER

(71) Applicant: Panasonic Intellectual Property Management Co., Ltd, Osaka (JP)

(72) Inventor: Kenya Yamashita, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 79 days.

(21) Appl. No.: 14/401,556

(22) PCT Filed: May 7, 2013

(86) PCT No.: PCT/JP2013/002941
§ 371 (c)(1),
(2) Date: Nov. 17, 2014

(87) PCT Pub. No.: WO2013/171996
PCT Pub. Date: Nov. 21, 2013

(65) Prior Publication Data
US 2015/0115423 A1    Apr. 30, 2015

(30) Foreign Application Priority Data

May 16, 2012  (JP) ............... 2012-112453
Jun. 8, 2012   (JP) ............... 2012-130680

(51) Int. Cl.
*H01L 23/24*    (2006.01)
*H01L 23/28*    (2006.01)
(Continued)

(52) U.S. Cl.
CPC ....... *H01L 23/49548* (2013.01); *H01L 23/043* (2013.01); *H01L 23/34* (2013.01);
(Continued)

(58) Field of Classification Search
CPC ............ H01L 23/49575; H01L 23/49537; H01L 23/49548; H01L 23/49562; H01L 23/49565; H01L 2924/30107
See application file for complete search history.

(56) References Cited

U.S. PATENT DOCUMENTS 5,420,459 A  *  5/1995  Kozono ............ H01L 24/49
                                                257/666
2002/0109211 A1   8/2002  Shinohara
(Continued)

FOREIGN PATENT DOCUMENTS

| CN | 101325197 | 12/2008 |
|---|---|---|
| CN | 101385142 | 3/2009 |

(Continued)

OTHER PUBLICATIONS

International Search Report for International Application No. PCT/JP2013/002941 mailed Jul. 23, 2013.
(Continued)

*Primary Examiner* — Mark Tornow
*Assistant Examiner* — Abbigale Boyle
(74) *Attorney, Agent, or Firm* — RatnerPrestia

(57) ABSTRACT

Included are: the third frame which is electrically connected to the first intermediate frame and is arranged above the first frame; the fourth frame which is electrically connected to the second intermediate frame and is arranged above the second frame; the electric source terminal part which is provided on an extension of the first frame; the ground terminal part which is provided on an extension of the fourth frame; and the output terminal part which is provided on an extension to which the second frame and the third frame are electrically joined, wherein the third frame and the fourth frame are arranged in parallel with each other, and the electric source terminal part, the ground terminal part and the output terminal part are arranged in a manner such that
(Continued)

induced electric voltages, which are generated in the third frame and the fourth frame, become in reverse directions with each other.

12 Claims, 10 Drawing Sheets

(51) Int. Cl.
| | |
|---|---|
| H01L 23/495 | (2006.01) |
| H01L 23/34 | (2006.01) |
| H01L 23/043 | (2006.01) |
| H01L 25/07 | (2006.01) |
| H01L 25/18 | (2006.01) |
| H01L 27/06 | (2006.01) |
| H01L 23/00 | (2006.01) |
| H01L 23/373 | (2006.01) |
| H01L 23/433 | (2006.01) |
| H01L 23/498 | (2006.01) |

(52) U.S. Cl.
CPC .. H01L 23/49517 (2013.01); H01L 23/49534 (2013.01); H01L 23/49537 (2013.01); H01L 23/49541 (2013.01); H01L 23/49575 (2013.01); H01L 25/07 (2013.01); H01L 25/18 (2013.01); H01L 27/0629 (2013.01); H01L 23/24 (2013.01); H01L 23/28 (2013.01); H01L 23/3735 (2013.01); H01L 23/4334 (2013.01); H01L 23/49589 (2013.01); H01L 23/49811 (2013.01); H01L 24/32 (2013.01); H01L 24/37 (2013.01); H01L 24/40 (2013.01); H01L 24/45 (2013.01); H01L 24/48 (2013.01); H01L 24/49 (2013.01); H01L 24/73 (2013.01); H01L 2224/32245 (2013.01); H01L 2224/37124 (2013.01); H01L 2224/37147 (2013.01); H01L 2224/40247 (2013.01); H01L 2224/45014 (2013.01); H01L 2224/45124 (2013.01); H01L 2224/45147 (2013.01); H01L 2224/48247 (2013.01); H01L 2224/4903 (2013.01); H01L 2224/73221 (2013.01); H01L 2224/73263 (2013.01); H01L 2224/73265 (2013.01); H01L 2924/01015 (2013.01); H01L 2924/1305 (2013.01); H01L 2924/13055 (2013.01); H01L 2924/13091 (2013.01); H01L 2924/30107 (2013.01)

(56) References Cited

U.S. PATENT DOCUMENTS

| | | |
|---|---|---|
| 2008/0304306 A1 | 12/2008 | Chang et al. |
| 2009/0015185 A1 | 1/2009 | Yoshida |
| 2010/0148298 A1* | 6/2010 | Takano ............ H01L 23/49575 257/500 |
| 2013/0286618 A1 | 10/2013 | Shibasaki |
| 2014/0035112 A1* | 2/2014 | Kadoguchi ....... H01L 23/49548 257/666 |

FOREIGN PATENT DOCUMENTS

| | | |
|---|---|---|
| JP | 2732767 | 12/1997 |
| JP | 2002033447 | 1/2002 |
| JP | 2004022960 | 1/2004 |
| JP | 2005347561 | 12/2005 |
| JP | 2007-329427 A | 12/2007 |
| JP | 2007329427 | 12/2007 |
| JP | 4346504 | 7/2009 |
| WO | 2007142038 | 12/2007 |
| WO | 2012039114 | 3/2012 |

OTHER PUBLICATIONS

Supplementary European Search Report for EP 13 79 0413, Jun. 15, 2015.
CN Office Action with Search Report and partial translation for 201380025535.8, dated Jul. 5, 2016, 7 pages.

* cited by examiner

SEMICONDUCTOR MODULE FOR ELECTRIC POWER

CROSS-REFERENCE TO RELATED APPLICATIONS

This application is a U.S. national phase application of PCT International Patent Application No. PCT/JP2013/002941 filed May 7, 2013, claiming the benefit of priority of Japanese Patent Application No. 2012-112453 filed May 16, 2012 and Japanese Patent Application No. 2012-130680 filed Jun. 8, 2012, all of which are incorporated by reference herein in their entirety.

TECHNICAL FIELD

An aspect of the present invention is what relates to structure of a semiconductor module for electric power.

BACKGROUND ART

Of a semiconductor module for electric power which converts electric power, high efficiency is required from the viewpoint of energy saving.

Because of that, as for a semiconductor element, progressing is a transition from an insulating gate-type bipolar transistor (IGBT) to a transistor, using a wide-band-gap-system semiconductor element (SiC or GaN) for electric power. Particularly, an insulating gate-type transistor using silicon carbide (SiC), which is of high voltage-resistance and able to realize low-temperature resistance, is capable of carrying out high-speed operation for the reason of its being a unipolar-type device, and practical use is expected.

For heat generation of the module during the operation, the heat generation from the semiconductor element occupies most of it. What is by the conduction loss of heat generation carried out when electric current flows in the device, and what is by the switching loss which is generated at the time of switching on the occasion of transit of the device from an ON state to an OFF state or from an OFF state to an ON state occupy most portions of the heat generation from the semiconductor element.

As having been described earlier, in case a semiconductor element for electric power which is configured with a wide-band-gap-system material is used, then high-frequency operation with the same loss becomes capable of being carried out since the switching loss is able to be drastically reduced. As a result thereof, the size of a reactor or a capacitance is able to be made small, and the electric power converting apparatus is able to be configured small. Therefore, because the volume of the inverter itself is able to be drastically reduced, since miniaturization and integration of the configuration of the apparatus itself becomes capable of being carried out, they are being expected.

At this point, in order to realize high-speed operationalization of the device, reduction of the inductance from the electric source side of the smoothing condenser to the ground side through each module phase becomes an important factor. If this inductance value becomes large, accompanying electric voltage heightening of the electric source electric voltage, electric current enlarging and speed heightening of the device, then it becomes a bad influence on the device. Specifically, a through electric current becomes a problem at the ON time and a jumping electric voltage at the OFF time, which, in the worst case, leads to destruction of an element.

Particularly, in a configuration in which plural chips are mounted, accompanying electric current enlarging, the electric current enlarging and the inductance value become in a contrary relation since the package size becomes large.

In Japanese Patent Application Publication No. 2004-22960, in order that the module realizes a low inductance on the occasion when plural semiconductor chips for electric power have been installed, a conventional art is disclosed.

In FIG. 10, a plan view of a conventional semiconductor module for electric power is shown, according to Japanese Patent Application Publication No. 2004-22960.

In this semiconductor module for electric power, adopted is an arrangement such that chips are lined in parallel inside the arm in order to carry out electric current enlarging, the busbars are arranged at the center, and the configuration is allowed to be such that the high-side side element group 73 and the low-side side element group 74 sandwich the busbars.

By arranging that the positive-electrode side inner-part-electrode 71 of the busbar and the negative-electrode side inner-part-electrode 72 of the busbar face each other and adopting a configuration such that the electric currents of each other flow in reverse orientations, a reducing effect of the inductance is being contemplated.

Like this, in the conventional semiconductor module for electric power, utilizing a principle (an effect of mutual inductance) that the busbars in which the electric currents flow in reverse orientations are arranged nearby so that the magnetic fields thereby cancel each other, inductance lowering is thereby being contemplated.

SUMMARY OF THE INVENTION

Problems to be Solved by the Invention

However, in the configuration of the above mentioned conventional semiconductor module for electric power, the module size enlarges, and sufficient reducing of the inductance component has been unable to be realized.

Namely, since a large electric current flows in the positive-electrode side inner-part-electrode 71 of the busbar and the negative-electrode side inner-part-electrode 72 of the busbar, in order to carry out inductance reducing, these have to be configured widely in width. As a result thereof, the module size enlarges for this busbar region, and the whole of the electric current route gets wide. And, for the whole of the electric current route having got wide, since the inductance component gets large, a sufficient reducing effect of the inductance component is unable to be obtained.

The present invention furnishes, in consideration of the above-mentioned conventional problems, a semiconductor module for electric power which miniaturizes the module size and is able to reduce the wiring inductance.

Means for Solving the Problem

In order to solve the above described problems, the $1^{st}$ aspect of the present invention is a semiconductor module for electric power, comprising:

a first frame where plural first transistors and first diodes are arranged;

a second frame where plural second transistors and second diodes are arranged;

a first intermediate frame which is adjacent to the first frame;

a second intermediate frame which is adjacent to the second frame;

a third frame which is electrically connected to the first intermediate frame, and is arranged above the first frame;

a fourth frame which is electrically connected to the second intermediate frame, and is arranged above the second frame;

an electric source terminal which is provided on an extension of the first frame;

a ground terminal which is provided on an extension of the fourth frame; and an output terminal which is provided on an extension to which the second frame and the third frame are electrically joined, wherein a drain electrode of the first transistor is connected to the first frame, a source electrode of the first transistor and an anode electrode of the first diode are connected to the first intermediate frame with first connecting lines of metal, a drain electrode of the second transistor is connected to the second frame, a source electrode of the second transistor and an anode electrode of the second diode are connected to the second intermediate frame with second connecting lines of metal, in neighborhoods of the first transistor and the second transistor, gate terminals and source terminals are arranged, all the frames are arranged on a heat radiating plate via an insulator which is configured with a resin-system material, and at least a part of all the frames is covered with a molding resin, and the third frame and the fourth frame are arranged in parallel with each other, and the electric source terminal, the ground terminal and the output terminal are arranged in a manner such that induced electric voltages, which are generated in the third frame and the fourth frame, become in reverse directions with each other.

Moreover, the $2^{nd}$ aspect of the present invention is a semiconductor module for electric power according to the $1^{st}$ aspect of the present invention, wherein connected to the first intermediate frame is a foot of the third frame, connected to the second intermediate frame is a foot of the fourth frame, the foot of the third frame is arranged between the plural first connecting lines, and the foot of the fourth frame is arranged between the plural second connecting lines.

Moreover, the $3^{rd}$ aspect of the present invention is a semiconductor module for electric power according to the $1^{st}$ aspect of the present invention, wherein the third frame is arranged so as to be placed above the first transistors and the first diodes, and the fourth frame is arranged so as to be placed above the second transistors and the second diodes.

Moreover, the $4^{th}$ aspect of the present invention is a semiconductor module for electric power according to the $1^{st}$ aspect of the present invention, wherein a gate electrode of the first transistor is arranged at a side opposite to the first intermediate frame, and a gate electrode of the second transistor is arranged at a side opposite to the second intermediate frame.

Moreover, the $5^{th}$ aspect of the present invention is a semiconductor module for electric power, comprising:

a first metal electric-conductor-island where plural first transistors and first diodes are arranged;

a second metal electric-conductor-island where plural second transistors and second diodes are arranged;

a first intermediate metal electric-conductor-island which is adjacent to the first metal electric-conductor-island;

a second intermediate metal electric-conductor-island which is adjacent to the second metal electric-conductor-island;

a fifth frame which is electrically connected to the first intermediate metal electric-conductor-island, and is arranged above the first metal electric-conductor-island;

a sixth frame which is electrically connected to the second intermediate metal electric-conductor-island, and is arranged above the second metal electric-conductor-island;

an electric source terminal which is provided on an extension of the first metal electric-conductor-island;

a ground terminal which is provided on an extension of the sixth frame; and an output terminal which is connected to the second metal electric-conductor-island, where the second metal electric-conductor-island and the fifth frame electrically join, wherein a drain electrode of the first transistor is connected to the first metal electric-conductor-island, a source electrode of the first transistor and an anode electrode of the first diode are connected to the first intermediate metal electric-conductor-island with first connecting lines of metal, a drain electrode of the second transistor is connected to the second metal electric-conductor-island, a source electrode of the second transistor and an anode electrode of the second diode are connected to the second intermediate metal electric-conductor-island with second connecting lines of metal, in neighborhoods of the first transistor and the second transistor, gate terminals and source terminals are arranged, all the metal electric-conductor-islands are arranged on a heat radiating plate via an insulator which is configured with a ceramic material, and at least a part of all the metal electric-conductor-islands is covered with a gel-like resin, and the fifth frame and the sixth frame are arranged in parallel with each other, and the electric source terminal, the ground terminal and the output terminal are arranged in a manner such that induced electric voltages, which are generated in the fifth frame and the sixth frame, become in reverse directions with each other.

Moreover, the $6^{th}$ aspect of the present invention is a semiconductor module for electric power according to the $5^{th}$ aspect of the present invention, wherein connected to the first intermediate metal electric-conductor-island is a foot of the fifth frame, connected to the second intermediate metal electric-conductor-island is a foot of the sixth frame, the foot of the fifth frame is arranged between the plural first connecting lines, and the foot of the sixth frame is arranged between the plural second connecting lines.

Moreover, the $7^{th}$ aspect of the present invention is a semiconductor module for electric power according to the $5^{th}$ aspect of the present invention, wherein the fifth frame is arranged so as to be placed above the first transistors and the first diodes, and the sixth frame is arranged so as to be placed above the second transistors and the second diodes.

Moreover, the $8^{th}$ aspect of the present invention is a semiconductor module for electric power according to the $1^{st}$ aspect of the present invention, wherein the first connecting lines and the second connecting lines are configured with ribbons.

Moreover, the 9th aspect of the present invention is a semiconductor module for electric power according to the 1st aspect of the present invention, wherein the first connecting lines and the second connecting lines are configured with clips.

Moreover, the 10th aspect of the present invention is a semiconductor module for electric power according to the 5th aspect of the present invention, wherein a gate electrode of the first transistor is arranged at a side opposite to the first intermediate metal electric-conductor-island, and a gate electrode of the second transistor is arranged at a side opposite to the second intermediate metal electric-conductor-island.

Moreover, the 11th aspect of the present invention is a semiconductor module for electric power according to the 5th aspect of the present invention, wherein the first connecting lines and the second connecting lines are configured with ribbons.

Moreover, the 12th aspect of the present invention is a semiconductor module for electric power according to the 5th aspect of the present invention, wherein the first connecting lines and the second connecting lines are configured with clips.

Effects of the Invention

By the present invention, a semiconductor module for electric power is able to be furnished which miniaturizes the module size and is able to reduce the wiring inductance.

MODES FOR IMPLEMENTING THE INVENTION (Embodiment 1)

Figure 1A:
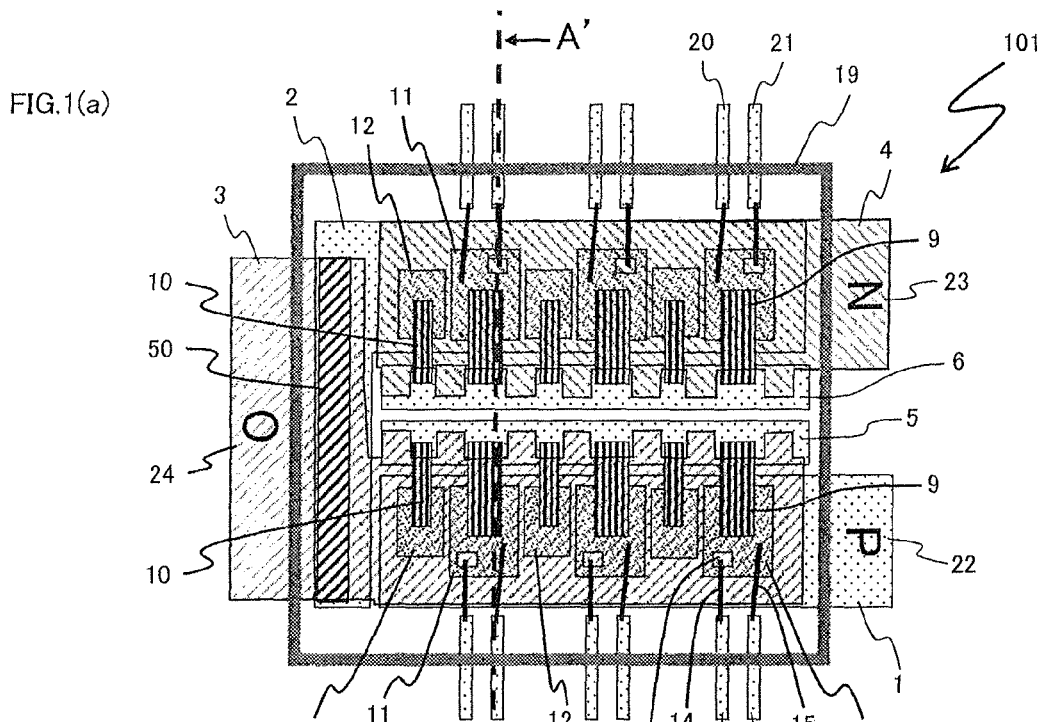
FIG. 1(a) is a plan view of the semiconductor module for electric power in Embodiment 1 of the present invention.

Shown in FIG. 1(a) is the module configuration 101 which is a plan view of the semiconductor module for electric power of a resin-sealing-type of Embodiment 1 of the present invention.

Figure 1B:
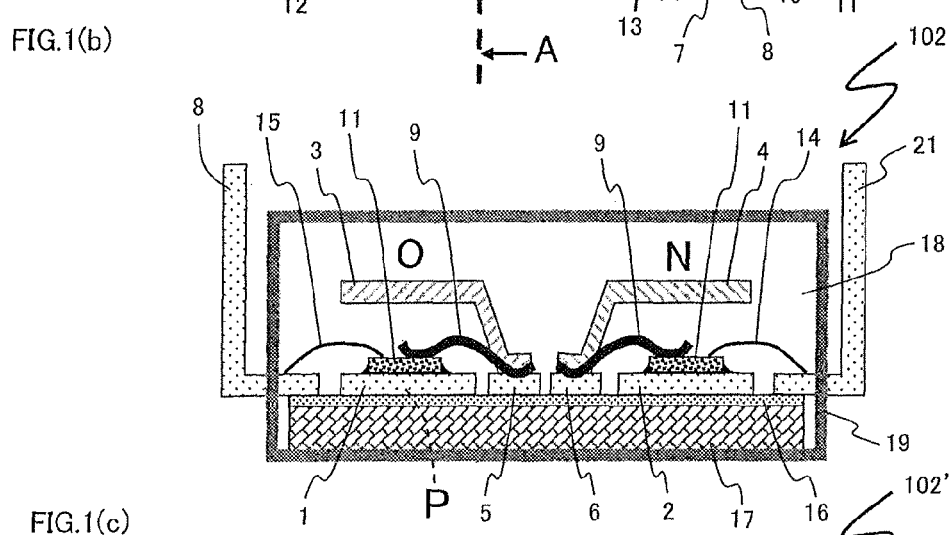
FIG. 1(b) is a section view of the semiconductor module for electric power in Embodiment 1 of the present invention, in A-A' of FIG. 1(a)

Moreover, shown in FIG. 1(b) is the section configuration 102 of the semiconductor module for electric power of the present Embodiment 1 such that cutting is carried out with A-A' in FIG. 1(a).

Moreover, in FIG. 2(a)-FIG. 2(f), an assembly flow diagram of the semiconductor module for electric power of the present Embodiment 1 is shown. FIG. 2(a)-FIG. 2(f) show, respectively, plan views at the time of assembly of the semiconductor module for electric power of the present Embodiment 1.

Before descriptions are given regarding the configuration of the semiconductor module for electric power of the present Embodiment 1, for a start descriptions are given regarding the assembly process of the semiconductor module for electric power of the present Embodiment 1, using FIG. 2(a)-FIG. 2(f).

Figure 2A:
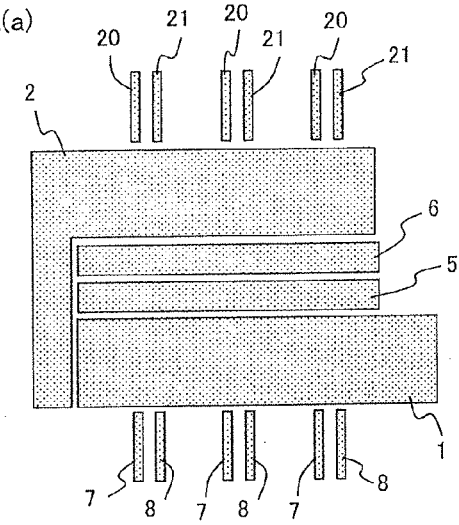
FIGS. 2(a)-(f) are plan views which show the assembly flow of the semiconductor module for electric power of Embodiment 1 of the present invention.

FIG. 2(a) is a plan view of the first frame 1, the second frame 2, the first intermediate frame 5, the second intermediate frame 6, the high-side side gate terminals 7, the low-side side source terminals 20, the high-side side source terminals 8, and the low-side side gate terminals 21, which are the lead frames of groundwork. At this point, in reality, these leads are fixed to a rim so as not to come apart, and are cut off from the rim after the final molding is completed, but there are omissions in regards to detailed descriptions of this portion.

Figure 2D:
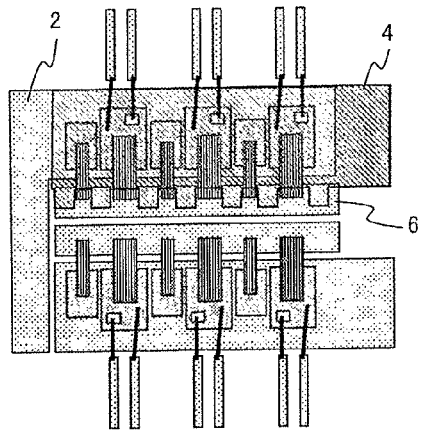
Figure 2B:
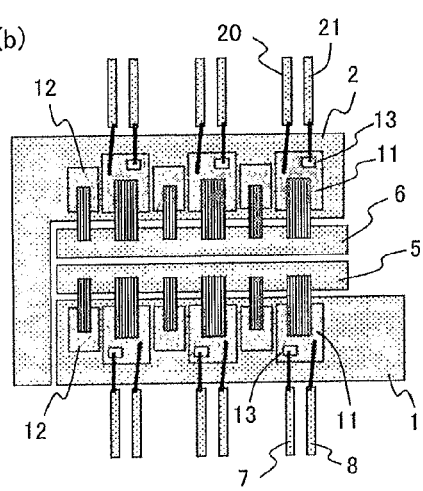

In FIG. 2(b), die-bonded and thereby mounted onto the lead frames described in FIG. 2(a) are the transistor chips 11 and the diode chips 12, which are semiconductor elements. As the transistor chip 11, a transistor like an IGBT or an SiC-MOSFET is mounted. At this time, connected to the first frame 1 and the second frame 2 is the drain electrode or the collector electrode of the transistor chip 11, which is mounted on the first frame 1 and the second frame 2, and also connected to the first frame 1 and the second frame 2 is the cathode electrode of the diode chip 12, which is mounted on the first frame 1 and the second frame 2.

In the semiconductor module for electric power of the present Embodiment 1, shown is an example such that, on one arm, three transistor chips 11 like an IGBT or an SiC-MOSFET and three diode chips 12 are alternately arranged.

After that, the source electrode or the emitter electrode of the transistor chip 11 which has been mounted on the first frame 1 is wire-connected to the first intermediate frame 5, and the source electrode or the emitter electrode of the transistor chip 11 which has been mounted on the second frame 2 is wire-connected to the second intermediate frame 6.

Further, the gate pad 13 of the transistor chip 11 which has been mounted on the first frame 1 and the gate terminal 7 on the high-side side of the lead frame are wire-connected, and the source pad of the transistor chip 11 and the source terminal 8 on the high-side side of the lead frame are wire-connected. Similarly, the gate pad 13 of the transistor chip 11 which has been mounted on the second frame 2 and the gate terminal 21 on the low-side side of the lead frame are wire-connected, and the source pad of the transistor chip 11 and the source terminal 20 on the low-side side of the lead frame are wire-connected.

Figure 2E:
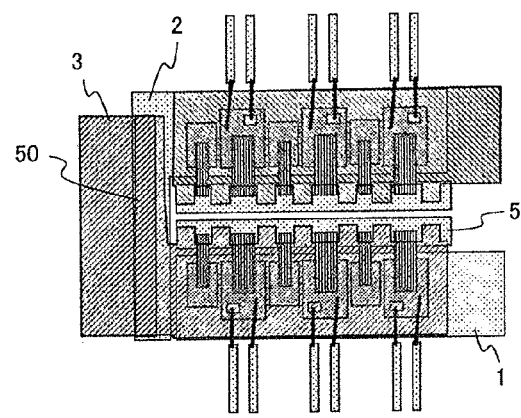
Figure 2C:
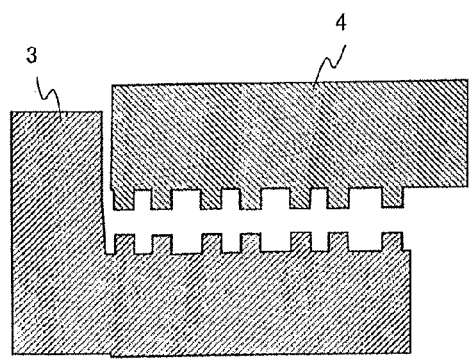

Next, in FIG. 2(c), prepared are the third frame 3 on the positive electrode side which functions as a busbar, and the fourth frame 4 on the negative electrode side.

And, in FIG. 2(d), the fourth frame 4 is arranged above the second frame 2, and the feet of the fourth frame 4 are metal-bonded to the second intermediate frame 6.

Next, in FIG. 2(e), the third frame 3 is arranged above the first frame 1, and the third frame 3 is metal-bonded at the bonding point 50, to the second frame 2. Moreover, the feet of the third frame 3 are metal-bonded to the first intermediate frame 5.

Figure 2F:
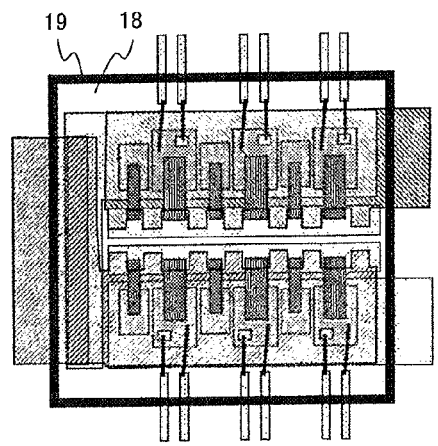

After that, in FIG. 2(f), molding is carried out by the insulating resin 18, the whole is sealed with the shape which is regulated with the outer rim 19 of the insulating resin, and thereby fixation of the module is carried out.

Through the assembly flow like this, the semiconductor module for electric power of the present Embodiment 1 is thereby finished.

Next, using FIG. 1(a) and FIG. 1(b), descriptions are given regarding the configuration of the semiconductor module for electric power of the present Embodiment 1 which is manufactured through the assembly flow shown in FIG. 2(a)-FIG. 2(f).

Gluing by a die-bond material is carried out, and thereby onto the first frame 1 and onto the second frame 2 plural semiconductor chips are mounted. These semiconductor chips are configured with the transistor chips 11 and the diode chips 12.

The first frame 1 and the second frame 2 are arranged on the heat radiating plate 17 via the insulator 16. It is good that the heat radiating plate 17 is configured with a material like Cu or Al such that the heat conduction rate is large. It is good that the insulator 16 is configured with a material such that the heat conduction property is good, and the electric insulation property is good as well.

For the whole of the wirings, molding is carried out by the insulating resin 18, and by the outer rim 19 of the insulating resin the shape of the module is defined.

Additionally, the configuration of the semiconductor module for electric power of the present Embodiment 1 which uses an SiC-MOSFET as the transistor chip 11 corresponds to an example of the semiconductor module for electric power of the present invention. Moreover, the transistor chips 11 and the diode chips 12 mounted onto the first frame 1 correspond, respectively, to examples of the first transistors and the first diodes of the present invention. Moreover, the transistor chips 11 and the diode chips 12 mounted onto the second frame 2 correspond, respectively, to examples of the second transistors and the second diodes of the present invention.

Between the first frame 1 and the second frame 2, the first intermediate frame 5 and the second intermediate frame 6 which are narrow in width compared with these frames are arranged, with the first intermediate frame 5 at the side near to the first frame 1 roughly in parallel, and the second intermediate frame 6 at the side near to the second frame 2 roughly in parallel.

The first intermediate frame 5 and the second intermediate frame 6 are, with reference to the center line of the semiconductor module for electric power, namely the line which in the plan view of FIG. 1(a), up and down bisects the module configuration 101, arranged at the positions which sandwich that center line and face each other.

Connection is carried out from the source electrode or the emitter electrode of the transistor chip 11 on the first frame 1 to the first intermediate frame 5 with the connecting line 9 of metal, and connection is carried out from the anode electrode of the diode chip 12 on the first frame 1 to the first intermediate frame 5 with the connecting line 10 of metal. To the places on the first intermediate frame 5, where the connecting lines 9, 10 of metal do not exist, the feet of the third frame 3 which is arranged above the first frame 1 are connected.

Connection is carried out from the source electrode or the emitter electrode of the transistor chip 11 on the second frame 2 to the second intermediate frame 6 with the connecting line 9 of metal, and connection is carried out from the anode electrode of the diode chip 12 on the second frame 2 to the second intermediate frame 6 with the connecting line 10 of metal. To the places on the second intermediate frame 6, where the connecting lines 9, 10 of metal do not exist, the feet of the fourth frame 4 which is arranged above the second frame 2 are connected.

Additionally, the connecting lines 9 and 10 of metal which connect the transistor chip 11 and the diode chip 12 on the first frame 1, and the first intermediate frame 5 correspond to examples of the first connecting lines of metal of the present invention. Moreover, the connecting lines 9 and 10 of metal which connect the transistor chip 11 and the diode chip 12 on the second frame 2, and the second intermediate frame 6 correspond to examples of the second connecting lines of metal of the present invention.

It is desirable that the configuration is allowed to be such that the third frame 3 is placed at least above the semiconductor-chip-installation-region of the first frame 1, namely the region where the three transistor chips 11 and the three diode chips 12 are mounted. And similarly, it is desirable that the configuration is allowed to be such that the fourth frame 4 is placed at least above the semiconductor-chip-installation-region of the second frame 2.

The connecting line 9 of metal which is used to carry out connection from the source electrode or the emitter electrode of the transistor chip 11 on the first frame 1 to the first intermediate frame 5 is, usually, configured with a plurality of wires of Al, and also tolerates a large electric current.

Nowadays, the configuration is allowed to be with a ribbon of Al or a ribbon of Cu, bonding reliability is thereby improved, and besides further electric current enlarging, high heat radiating property are able to be realized. Moreover, a similar function is capable of being realized even if an Al clip, a Cu clip or a clip composed of other materials is used, in lieu of the connecting line 9 of metal.

Also for the connecting line 10 of metal which is used to carry out connection from the anode electrode of the diode chip 12 to the first intermediate frame 5, the above-mentioned is similarly true.

Moreover, also for the connecting lines 9 and 10 of metal which are used to carry out line-tying of the transistor chip 11 and the diode chip 12 on the second frame 2, and the second intermediate frame 6, the above-mentioned is similarly true.

The electric source terminal part 22 on an extension of the first frame 1 has a function as an electrode, and functions as a P (electric source) terminal.

The ground terminal part 23 on an extension of the fourth frame 4 has a function as an electrode, and functions as an N (ground) terminal.

For the third frame 3 and the second frame 2, line-tying is carried out at the metal bonding point 50 which is arranged at the side reverse to the P terminal and the N terminal, and the output terminal part 24 on an extension of the third frame 3 has a function as an electrode, and functions as an O (output) terminal.

As shown in FIG. 1(a), the third frame 3 and the fourth frame 4 are arranged in parallel with each other, the O terminal is in addition arranged at the side reverse to the P terminal and the N terminal, respective electric currents of the third frame 3 which is the positive-electrode side busbar and the fourth frame 4 which is the negative-electrode side busbar thereby flow in reverse directions and, with an effect of mutual inductance, the inductance is able to be allowed to reduce. In other words, in a manner such that induced electric voltages which are generated in the third frame 3 and the fourth frame 4 become in reverse directions with each other, the electric source terminal part 22 (the P terminal), the ground terminal part 23 (the N terminal) and the output terminal part 24 (the O terminal) are arranged.

By the configuration like this, the first intermediate frame 5, the second intermediate frame 6, the third frame 3 and the fourth frame 4 are used in combination, since the space over the semiconductor chips is able to be utilized as wirings (busbars) of wide width which is able to realize inductance lowering, miniaturization of the semiconductor module for electric power is thereby also able to be realized and, because the arrangements of the first frame 1 and the second frame 2 which are installing the semiconductor chips are able to be allowed to come close, realization of further inductance lowering becomes capable of being achieved.

In regards to a gate wiring, it is advantageous that the distance from the gate driver is configured to be shortest. Therefore, it is good that in neighborhoods of the respective transistors, the high-side side gate terminals 7 and the low-side side gate terminals 21 as leads which are for gate wirings, and the high-side side source terminals 8 and the low-side side source terminals 20 as leads which are for source wirings have been formed.

Desirable is a configuration such that gate drivers are arranged to the respective transistor chips 11 but, particularly, in a use such that high-speed operation is not necessary, the configuration may be such that the gates of plural transistor chips or the sources are gathered to one lead.

To the high-side side gate terminal 7 and the low-side side gate terminal 21 which are leads that are for gate wirings, the gate wirings 14 of metal are formed from the gate pads 13 of the transistor chips 11. Moreover, to the high-side side source terminal 8 and the low-side side source terminal 20 which are leads that are for source wirings, the source wirings 15 of metal are formed.

By this configuration, from the transistor chip 11, to the lead which is for a gate wiring and the lead which is for a source wiring, electrical connections are carried out by metal wirings.

Nevertheless, the configuration is allowed to be such that the gate electrode of the transistor chip 11 on the first frame 1 is, as shown in FIG. 1(a), arranged at the opposite side with the first intermediate frame 5 at the center of the semiconductor module for electric power, and the configuration is allowed to be such that the gate electrode of the transistor chip 11 on the second frame 2 is arranged at the opposite side with the second intermediate frame 6 at the center of the semiconductor module for electric power, which then leads to the wirings becoming short and is advantageous.

In order to carry out insulation between these frames it is desirable to adopt a configuration such that, as shown in FIG. 1(b), the insulator 16 is arranged on the heat radiating plate 17 which is arranged at the lower face side, with each frame arranged thereon, and that the molding is carried out by the insulating resin 18 so as to be regulated with the outer rim 19 of the insulating resin.

Not limited to the examples shown here, the number and arrangement of semiconductor chips are, since being determined in arbitrary combination with the electric current rating of the semiconductor module for electric power, not particularly regulated.

For the minimum configuration unit of the semiconductor chip number, only one transistor chip, or the transistor chip and diode chip is the one configuration but, since even if the configuration is like this, there is a requirement of inductance reducing in order to achieve high-speed operation of the device, the effect by applying the configuration of the semiconductor module for electric power of the present Embodiment 1 is large.

Particularly, it is not necessary that the number of transistor chips and the number of diode chips coincide and, even if these numbers do not coincide, the effects of the present Embodiment 1 are exhibited.

(Embodiment 2)

In Embodiment 1, the present invention has been described with a module of a resin-sealing-type, but the concept of the present invention is not limited to this and, even if applied to a module formed on a metal insulating substrate, similar effects are obtained. Even with other embodiments, similar effects are obtained.

Figure 3A:
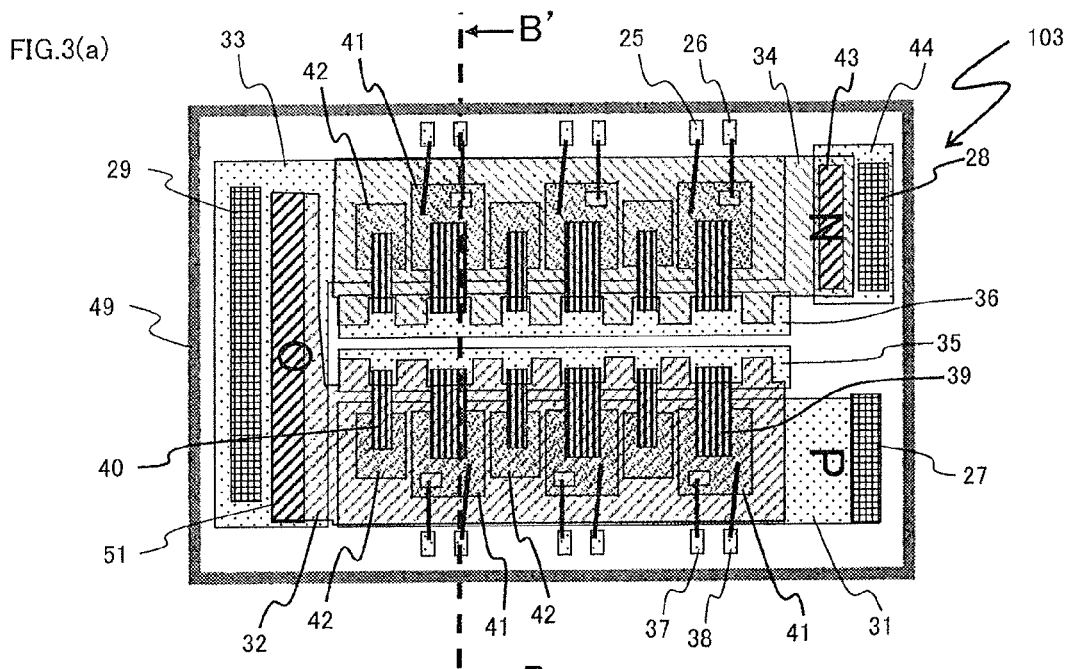
FIG. 3(a) is a plan view of the semiconductor module for electric power in Embodiment 2 of the present invention.

As Embodiment 2 of the present invention, the module configuration 103 which is a plan view of the semiconductor module for electric power of a metal-insulating-substrate-type is shown in FIG. 3(a).

Figure 3B:
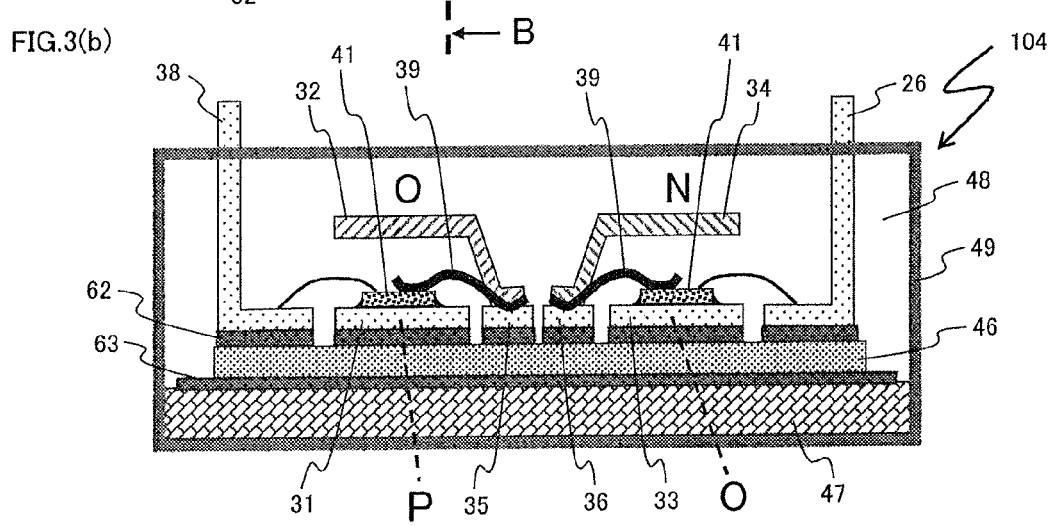
FIG. 3(b) is a section view of the semiconductor module for electric power in Embodiment 2 of the present invention, in B-B' of FIG. 3(a)

Moreover, shown in FIG. 3(b) is the section configuration 104 of the semiconductor module for electric power of the present Embodiment 2 such that cutting is carried out with B-B' in FIG. 3(a).

Moreover, in FIG. 4(a)-FIG. 4(f), an assembly flow diagram of the semiconductor module for electric power of the present Embodiment 2 is shown. FIG. 4(a)-FIG. 4(f) show, respectively, plan views at the time of assembly of the semiconductor module for electric power of the present Embodiment 2.

Before descriptions are given regarding the configuration of the semiconductor module for electric power of the present Embodiment 2, for a start descriptions are given regarding the assembly process of the semiconductor module for electric power of the present Embodiment 2, using FIG. 4(a)-FIG. 4(f).

Figure 4A:
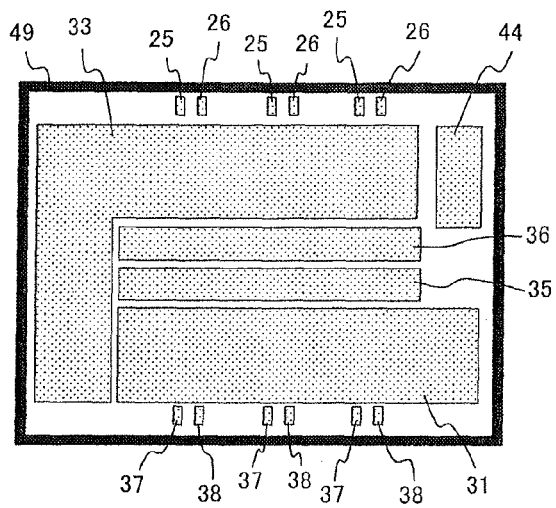
FIGS. 4(a)-(f) are plan views which show the assembly flow of the semiconductor module for electric power of Embodiment 2 of the present invention.
Figure 4D:
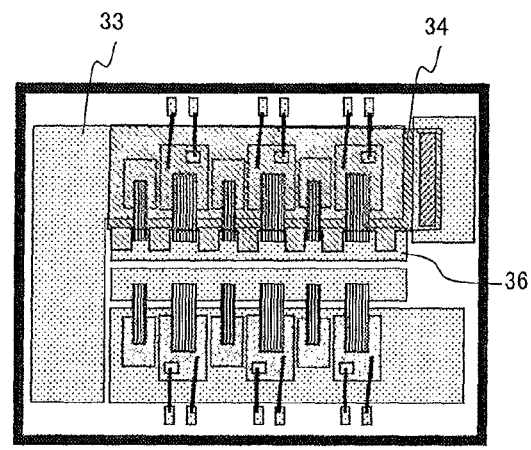
Figure 4B:
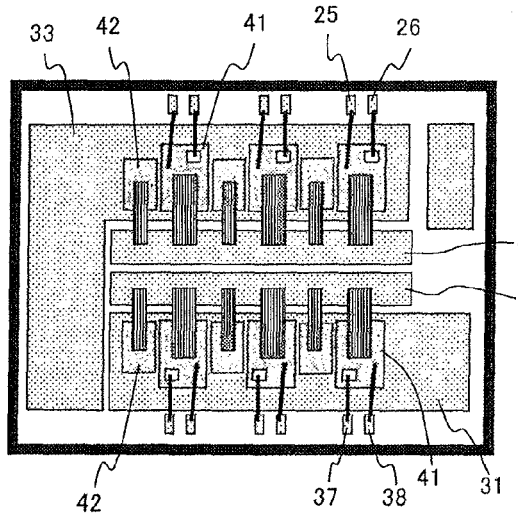
Figure 4E:
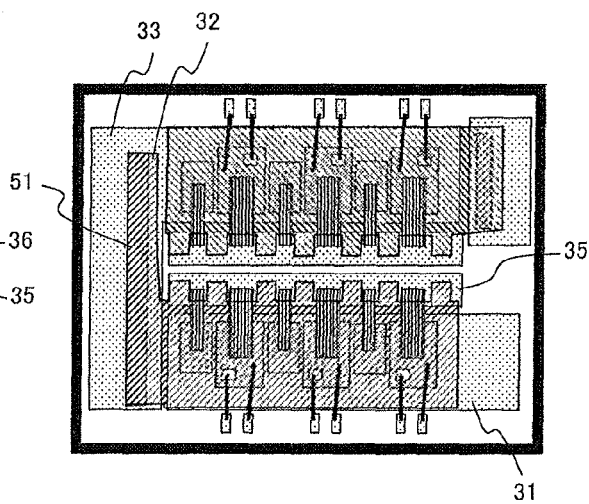
Figure 4C:
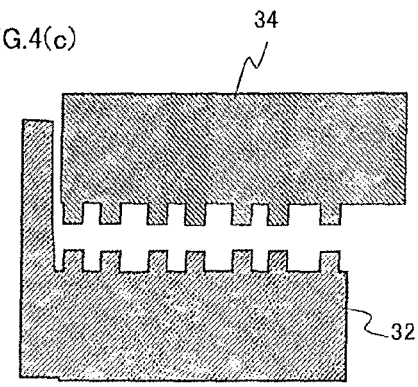
Figure 4F:
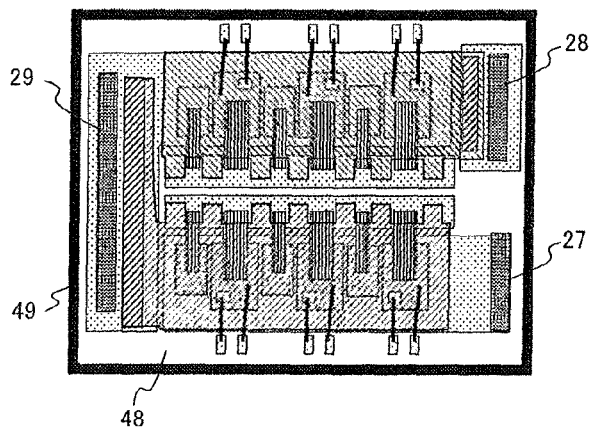

FIG. 4(a) is a wiring pattern diagram on the ceramic substrate of groundwork.

Formed on the substrate are the first metal electric-conductor-island 31, the second metal electric-conductor-island 33, the first intermediate metal electric-conductor-island 35, the second intermediate metal electric-conductor-island 36, the island 44 for forming a ground terminal, the high-side side gate terminals 37, the low-side side source terminals 25, the high-side side source terminals 38, the low-side side gate terminals 26, which are the patterns of copper foil. This ceramic substrate is being attached to the case 49.

Figure 3C:
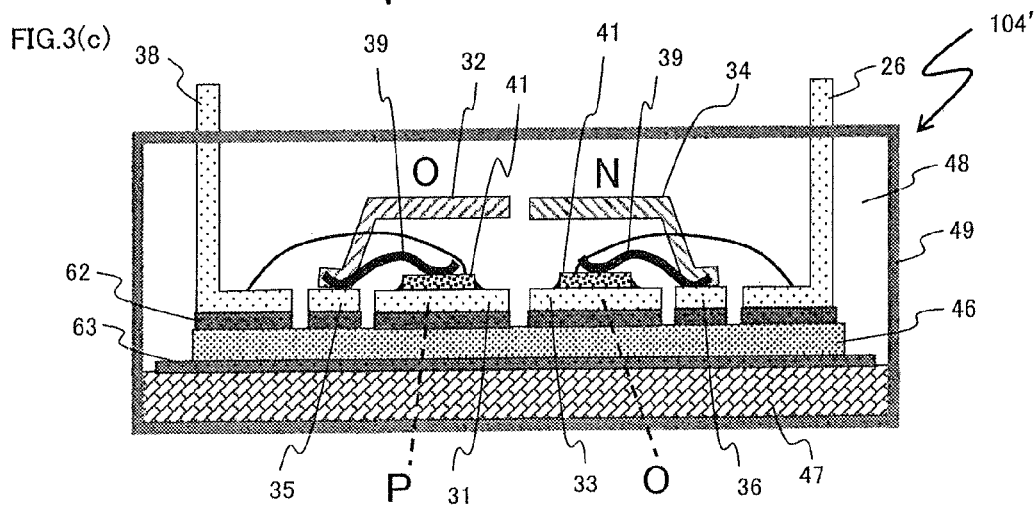
FIG. 3(c) is a section view of a modified example of the semiconductor module for electric power in Embodiment 2 of the present invention.

The ceramic substrate shown in FIG. 3(*b*) as the insulator 46 is attached via the gluing layer 63 onto the heat radiating plate 47 and configured, but descriptions are omitted in regards to detailed descriptions of this portion.

In FIG. 4(*b*), die-bonded and thereby mounted onto the first metal electric-conductor-island 31 and the second metal electric-conductor-island 33 which are lead frames are the transistor chips 41 and the diode chips 42, which are semiconductor elements. As the transistor chip 41, a transistor like an IGBT or an SiC-MOSFET is mounted. At this time, connected to the first metal electric-conductor-island 31 and the second metal electric-conductor-island 33 is the drain electrode or the collector electrode of the transistor chip 41, which is mounted on the first metal electric-conductor-island 31 and the second metal electric-conductor-island 33, and also connected to the first metal electric-conductor-island 31 and the second metal electric-conductor-island 33 is the cathode electrode of the diode chip 42, which is mounted on the first metal electric-conductor-island 31 and the second metal electric-conductor-island 33.

In the semiconductor module for electric power of the present Embodiment 2, shown is an example such that, on one arm, three transistor chips 41 like an IGBT or an SiC-MOSFET and three diode chips 42 are alternately arranged.

After that, the source electrode or the emitter electrode of the transistor chip 41 which has been mounted on the first metal electric-conductor-island 31 is wire-connected to the first intermediate metal electric-conductor-island 35, and the source electrode or the emitter electrode of the transistor chip 41 which has been mounted on the second metal electric-conductor-island 33 is wire-connected to the second intermediate metal electric-conductor-island 36.

Further, the gate pad of the transistor chip 41 which has been mounted on the first metal electric-conductor-island 31 and the gate terminal 37 on the high-side side of the lead frame are wire-connected, and the source pad of the transistor chip 41 and the source terminal 38 on the high-side side of the lead frame are wire-connected. Similarly, the gate pad of the transistor chip 41 which has been mounted on the second metal electric-conductor-island 33 and the gate terminal 26 on the low-side side of the lead frame are wire-connected, and the source pad of the transistor chip 41 and the source terminal 25 on the low-side side of the lead frame are wire-connected.

Next, in FIG. 4(*c*), prepared are the fifth frame 32 on the positive electrode side which functions as a busbar, and the sixth frame 34 on the negative electrode side.

And, in FIG. 4(*d*), the sixth frame 34 is arranged above the second metal electric-conductor-island 33, and the feet of the sixth frame 34 are metal-bonded to the second intermediate metal electric-conductor-island 36.

Next, in FIG. 4(*e*), the fifth frame 32 is arranged above the first metal electric-conductor-island 31, and the fifth frame 32 is metal-bonded at the bonding point 51, to the second metal electric-conductor-island 33. Moreover, the feet of the fifth frame 32 are metal-bonded to the first intermediate metal electric-conductor-island 35.

After that, in FIG. 4(*f*), the electric source terminal 27, the ground terminal 28 and the output terminal 29 are formed. At last, the silicone gel 48 is injected into the case 49 and thereby allowing insulating strength to be stable.

Through the assembly flow like this, the semiconductor module for electric power of the present Embodiment 2 is thereby finished.

Next, using FIG. 3(*a*) and FIG. 3(*b*), descriptions are given regarding the configuration of the semiconductor module for electric power of the present Embodiment 2 which is manufactured through the assembly flow shown in FIG. 4(*a*)-FIG. 4(*f*).

The insulator 46 is configured with a ceramic substrate. For example, an aluminum nitride (AlN) substrate or a silicon nitride (SiN) substrate is most suitable and, alternatively, one like an alumina ($Al_2O_3$) substrate is also often used, so that a thick metal wiring which can allow a large electric current to flow in the surface thereof is formed.

As shown in FIG. 3(*a*), between the first metal electric-conductor-island 31 and the second metal electric-conductor-island 33 which are arranged roughly in parallel with each other, the first intermediate metal electric-conductor-island 35 and the second intermediate metal electric-conductor-island 36 which are narrow in width compared with these islands are arranged, with the first intermediate metal electric-conductor-island 35 at the side near to the first metal electric-conductor-island 31 roughly in parallel, and the second intermediate metal electric-conductor-island 36 at the side near to the second metal electric-conductor-island 33 roughly in parallel.

The first intermediate metal electric-conductor-island 35 and the second intermediate metal electric-conductor-island 36 are, with reference to the center line of the semiconductor module for electric power, namely the line which in the plan view of FIG. 3(*a*), up and down bisects the external form of the case 49, arranged at the positions which sandwich that center line and face each other.

Gluing by a die-bond material is carried out, and thereby onto the first metal electric-conductor-island 31 and onto the second metal electric-conductor-island 33 plural semiconductor chips are mounted. These semiconductor chips are configured with the transistor chips 41 and the diode chips 42.

The first metal electric-conductor-island 31 and the second metal electric-conductor-island 33 are arranged on the heat radiating plate 47 via the insulator 46. The first metal electric-conductor-island 31, the second metal electric-conductor-island 33 are fixed to the insulator 46 by the gluing layer 62. It is good that the heat radiating plate 47 is configured with a material like Cu or Al such that the heat conduction rate is large. The insulator 46 is fixed to the heat radiating plate 47 by the gluing layer 63. It is good that the insulator 46 is configured with a material such that the heat conduction property is good, and the electric insulation property is good as well.

Additionally, the configuration of the semiconductor module for electric power of the present Embodiment 2 which uses an SiC-MOSFET as the transistor chip 41 corresponds to an example of the semiconductor module for electric power of the present invention. Moreover, the transistor chips 41 and the diode chips 42 mounted onto the first metal electric-conductor-island 31 correspond, respectively, to examples of the first transistors and the first diodes of the present invention. Moreover, the transistor chips 41 and the diode chips 42 mounted onto the second metal electric-conductor-island 33 correspond, respectively, to examples of the second transistors and the second diodes of the present invention.

The whole of the semiconductor module for electric power of the present Embodiment 2 is, with the external form being decided by the case 49, filled by the high heat-resistance silicone gel 48 or the like, and the resistance-electric-voltage and the like are insured.

Connection is carried out from the source electrode or the emitter electrode of the transistor chip 41 on the first metal electric-conductor-island 31 to the first intermediate metal electric-conductor-island 35 with the connecting line 39 of metal, and connection is carried out from the anode electrode of the diode chip 42 on the first metal electric-conductor-island 31 to the first intermediate metal electric-conductor-island 35 with the connecting line 40 of metal. To the places on the first intermediate metal electric-conductor-island 35, where the connecting lines 39, 40 of metal do not exist, the feet of the fifth frame 32 which is arranged above the first metal electric-conductor-island 31 are connected.

Connection is carried out from the source electrode or the emitter electrode of the transistor chip 41 on the second metal electric-conductor-island 33 to the second intermediate metal electric-conductor-island 36 with the connecting line 39 of metal, and connection is carried out from the anode electrode of the diode chip 42 on the second metal electric-conductor-island 33 to the second intermediate metal electric-conductor-island 36 with the connecting line 40 of metal. To the places on the second intermediate metal electric-conductor-island 36, where the connecting lines 39, 40 of metal do not exist, the feet of the sixth frame 34 which is arranged above the second metal electric-conductor-island 33 are connected.

Additionally, the connecting lines 39 and 40 of metal which connect the transistor chip 41 and the diode chip 42 on the first metal electric-conductor-island 31, and the first intermediate metal electric-conductor-island 35 correspond to examples of the first connecting lines of metal of the present invention. Moreover, the connecting lines 39 and 40 of metal which connect the transistor chip 41 and the diode chip 42 on the second metal electric-conductor-island 33, and the second intermediate metal electric-conductor-island 36 correspond to examples of the second connecting lines of metal of the present invention.

It is desirable that the configuration is allowed to be such that the fifth frame 32 is placed at least above the semiconductor-chip-installation-region of the first metal electric-conductor-island 31, namely the region where the three transistor chips 41 and the three diode chips 42 are mounted. And similarly, it is desirable that the configuration is allowed to be such that the sixth frame 34 is placed at least above the semiconductor-chip-installation-region of the second metal electric-conductor-island 33.

The connecting line 39 of metal which is used to carry out connection from the source electrode or the emitter electrode of the transistor chip 41 on the first metal electric-conductor-island 31 to the first intermediate metal electric-conductor-island 35 is, usually, configured with a plurality of wires of Al, and also tolerates a large electric current.

Nowadays, the configuration is allowed to be with a ribbon of Al or a ribbon of Cu, bonding reliability is thereby improved, and besides further electric current enlarging, high heat radiating property are able to be realized. Moreover, a similar function is capable of being realized even if an Al clip, a Cu clip or a clip composed of other materials is used, in lieu of the connecting line 39 of metal.

Also for the connecting line 40 of metal which is used to carry out connection from the anode electrode of the diode chip 42 to the first intermediate metal electric-conductor-island 35, the above-mentioned is similarly true.

The extension portion of the first metal electric-conductor-island 31 has a function as an electrode, and functions as the P (electric source) terminal 27.

The extension portion of the sixth frame 34 has a function as an electrode, and is connected with the N (ground) terminal 28. At this point it is desirable to allow, with the island 44 for forming a ground terminal (N) having been provided, the sixth frame to here bond with the bonding point 43 and thereby form the terminal.

For the fifth frame 32 and the second metal electric-conductor-island 33, line-tying is carried out at the metal bonding point 51 which is arranged at the side reverse to the P terminal 27 and the N terminal 28, and the extension portion of the second metal electric-conductor-island 33 has a function as an electrode, and functions as the O (output) terminal 29.

Like this, the first intermediate metal electric-conductor-island 35 and the second intermediate metal electric-conductor-island 36 are utilized and, since the space over the semiconductor chips is able to be configured as busbars, the busbars thereby become able to be broadened at least for the region the semiconductor chips occupy, so that inductance lowering becomes capable of being realized with wirings of wide width used.

Moreover, the size of the semiconductor module for electric power also becomes capable of being allowed to drastically reduce. Therefore, the wiring length also becomes short and the effect is large since inductance lowering can be further contemplated.

In regards to a gate wiring, it is advantageous that the distance from the gate driver is configured to be shortest. Therefore, it is good that in neighborhoods of the respective transistors, the high-side side gate terminals 37 and the low-side side gate terminals 26 as leads which are for gate wirings, and the high-side side source terminals 38 and the low-side side source terminals 25 as leads which are for source wirings have been formed.

Desirable is a configuration such that gate drivers are arranged to the respective transistor chips 41 but, particularly, in a use such that high-speed operation is not necessary, the configuration may be such that the gates of plural transistor chips or the sources are gathered to one lead.

By this configuration, from the transistor chip 41, to the lead which is for a gate wiring and the lead which is for a source wiring, electrical connections are carried out by metal wirings.

Nevertheless, the configuration is allowed to be such that the gate electrode of the transistor chip 41 on the first metal electric-conductor-island 31 is, as shown in FIG. 3(a), arranged at the opposite side with the first intermediate metal electric-conductor-island 35 at the center of the semiconductor module for electric power, and the configuration is allowed to be such that the gate electrode of the transistor chip 41 on the second metal electric-conductor-island 33 is arranged at the opposite side with the second intermediate metal electric-conductor-island 36 at the center of the semiconductor module for electric power, which then leads to the wirings becoming short and is advantageous.

In order to carry out insulation between these frames, it is desirable to adopt a configuration such that the insulator 46 is arranged on the heat radiating plate 47 which is arranged at the lower face side, with each frame arranged thereon, and that sealing is carried out with the silicone gel 48.

Not limited to the examples shown here, the number and arrangement of semiconductor chips are, since being determined in arbitrary combination with the electric current rating of the semiconductor module for electric power, not particularly regulated.

For the minimum configuration unit of the semiconductor chip number, only one transistor chip, or the transistor chip and diode chip is the one configuration but, since even if the configuration is like this, there is a requirement of inductance reducing in order to achieve high-speed operation of the device, the effect by applying the configuration of the semiconductor module for electric power of the present Embodiment 2 is large.

Additionally, also in the configuration of the present Embodiment 2, similarly to Embodiment 1, it is not necessary that the number of transistor chips and the number of diode chips coincide.

As having been described in the foregoing, by the configuration of the semiconductor module for electric power of each embodiment, since lead frames wide in width are arranged in the space over the semiconductor elements and thereby the positive-electrode busbar, the negative-electrode busbar are configured, the wiring inductance is able to be reduced, and the module size is able to be miniaturized. As a result thereof, the configuration of the semiconductor module for electric power becomes capable of being allowed to be strong against noise. Moreover, because direct busbar connection to a semiconductor element is not carried out, bonding reliability becomes capable of being remarkably improved.

Figure 10:
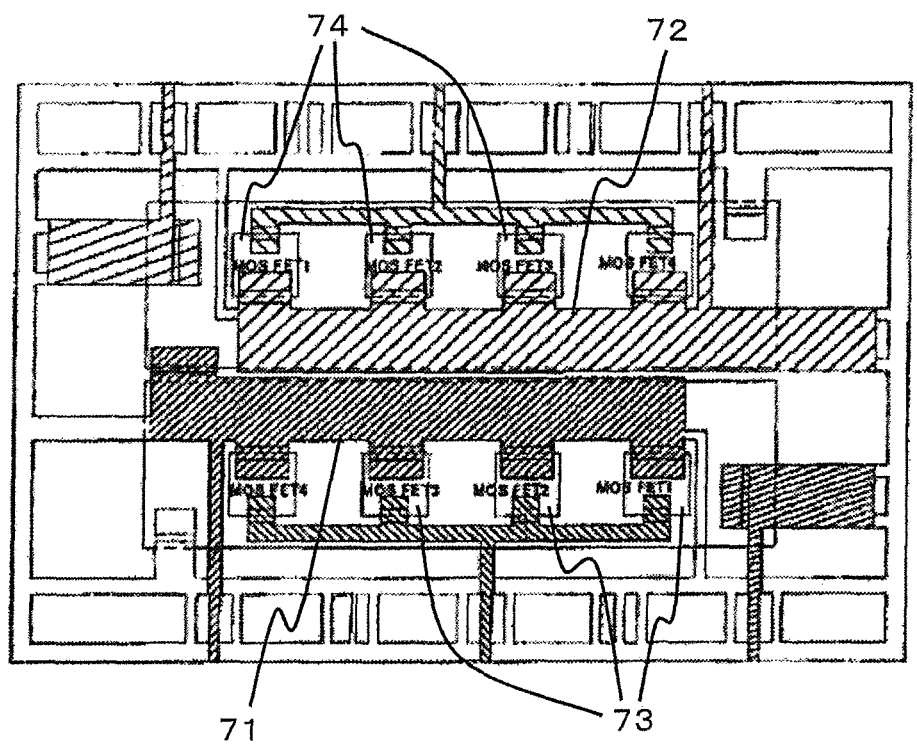
FIG. 10 is a plan view of the conventional semiconductor module for electric power.

Additionally, in the conventional configuration shown in FIG. 10, because direct bonding of a busbar and a semiconductor chip is carried out, if there is a temperature distribution among the configuring semiconductor chips, then on the bonding interface large stress is imposed and there has also been a problem that reliability of the device is deteriorated. In more detail, at a portion where the temperature is high the expansion is large and at a portion of a low temperature the expansion is small, so it has been also found out that there occur defects like cracking in a bonding part of a busbar and a semiconductor chip after utilization for a long period of time, and cracking in a die-bond material between a semiconductor chip and a die pad. As a result of various experiments, it has been also found out that linking plural semiconductor chips with one busbar is a configuration which is not preferable on reliability insurance.

By the configuration of the present invention described in each embodiment, because line-tying is able to be realized with a metal bonding between a frame and a frame instead of a bonding between a semiconductor chip and a frame, larger heat, vibration stress are impressed and thereby firm bonding is able to be realized. In regards to bonding of a semiconductor chip and an intermediate frame, in case a wiring for every semiconductor chip is carried out and thereby respective bondings between a semiconductor chip and a frame are able to individually insure reliability even if a temperature distribution among the semiconductor chips is generated, then reliability of the whole is able to be improved. The configuration is allowed to be like this, and thereby it has been found out that the conventional problem described in the above-mentioned is able to be solved.

As having been described in the foregoing, by the configuration of a semiconductor module for electric power of the present invention, even if strong bonding of a semiconductor chip and a busbar which is difficult is not realized, since by a configuration which combines an intermediate frame and a busbar frame wide in width, a configuration of wide width is able to be realized because the positive-electrode side busbar and the negative-electrode side busbar both become able to be arranged in the space over the semiconductor chips, the wiring inductance becomes capable of being drastically reduced in comparison with the conventional art. By means of this, a semiconductor module for electric power which is strong against noise as the whole of the module with high reliability becomes capable of being furnished. Moreover, because it is not necessary to insure busbar regions at the same time, the module size becomes capable of being miniaturized.

Figure 1C:
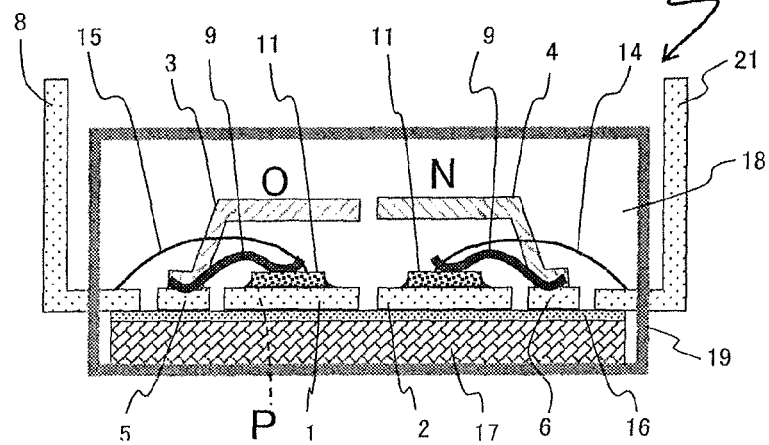
FIG. 1(c) is a section view of a modified example of the semiconductor module for electric power in Embodiment 1 of the present invention.

Additionally, in the above-mentioned embodiment, descriptions are given regarding the case where the first intermediate frame 5 and the second intermediate frame 6 are arranged between the first frame 1 and the second frame 2 (refer to FIG. 1(*b*)) but, not limited to this, for example, as shown in FIG. 1(*c*), the first intermediate frame 5 and the second intermediate frame 6 may be arranged at the outsides of the first frame 1 and the second frame 2. At this point, FIG. 1(*c*) is a section view which shows the section configuration 102' of the semiconductor module for electric power as a modified example of the semiconductor module for electric power shown in FIGS. 1(*a*), (*b*) in Embodiment 1 of the present invention.

Additionally, in the above-mentioned embodiment, descriptions are given regarding the case where the first intermediate metal electric-conductor-island 35 and the second intermediate metal electric-conductor-island 36 are arranged between the first metal electric-conductor-island 31 and the second metal electric-conductor-island 33 (refer to FIG. 3(*b*)) but, not limited to this, for example, as shown in FIG. 3(*c*), the first intermediate metal electric-conductor-island 35 and the second intermediate metal electric-conductor-island 36 may be arranged at the outsides of the first metal electric-conductor-island 31 and the second metal electric-conductor-island 33. At this point, FIG. 3(*c*) is a section view which shows the section configuration 104' of the semiconductor module for electric power as a modified example of the semiconductor module for electric power shown in FIGS. 3(*a*), (*b*) in Embodiment 2 of the present invention.

(Embodiment 3)

Shown in FIG. 5(*a*) is the module configuration 1101 which is a plan view of the semiconductor module for electric power of a resin-sealing-type of Embodiment 3 of the present invention.

Moreover, shown in FIG. 5(*b*) is the section configuration 1102 of the semiconductor module for electric power of the present Embodiment 3 such that cutting is carried out with A-A' in FIG. 5(*a*).

Moreover, in FIG. 6(*a*)-FIG. 6(*e*), an assembly flow diagram of the semiconductor module for electric power of the present Embodiment 3 is shown. FIG. 6(*a*)-FIG. 6(*e*) show, respectively, plan views at the time of assembly of the semiconductor module for electric power of the present Embodiment 3.

Before descriptions are given regarding the configuration of the semiconductor module for electric power of the present Embodiment 3, for a start descriptions are given regarding the assembly process of the semiconductor module for electric power of the present Embodiment 3, using FIG. 6(*a*)-FIG. 6(*e*).

FIG. 6(*a*) is a plan view of the first frame 301, the second frame 302, the first intermediate frame 305, the second intermediate frame 306, the high-side side gate terminals 307, the low-side side source terminals 320, the high-side side source terminals 308, and the low-side side gate terminals 321, which are the lead frames of groundwork. At this point, in reality, these leads are fixed to a rim so as not to come apart, and are cut off from the rim after the final molding is completed, but there are omissions in regards to detailed descriptions of this portion.

In FIG. 6(*b*), die-bonded and thereby mounted onto the lead frames described in FIG. 6(*a*) are the transistor chips 311 and the diode chips 312, which are semiconductor elements. As the transistor chip 311, a transistor like an IGBT or an SiC-MOSFET is mounted. At this time, connected to the first frame 301 and the second frame 302 is the drain electrode or the collector electrode of the transistor chip 311, which is mounted on the first frame 301 and the second frame 302, and also connected to the first frame 301 and the second frame 302 is the cathode electrode of the diode chip 312, which is mounted on the first frame 301 and the second frame 302.

In the semiconductor module for electric power of the present Embodiment 3, shown is an example such that, on one arm, three transistor chips 311 like an IGBT or an SiC-MOSFET and three diode chips 312 are alternately arranged.

After that, the source electrode or the emitter electrode of the transistor chip 311 which has been mounted on the first frame 301 is wire-connected to the first intermediate frame 305, and the source electrode or the emitter electrode of the transistor chip 311 which has been mounted on the second frame 302 is wire-connected to the second intermediate frame 306.

Further, the gate pad 313 of the transistor chip 311 which has been mounted on the first frame 301 and the gate terminal 307 on the high-side side of the lead frame are wire-connected, and the source pad of the transistor chip 311 and the source terminal 308 on the high-side side of the lead frame are wire-connected. Similarly, the gate pad 313 of the transistor chip 311 which has been mounted on the second frame 302 and the gate terminal 321 on the low-side side of the lead frame are wire-connected, and the source pad of the transistor chip 311 and the source terminal 320 on the low-side side of the lead frame are wire-connected.

Figure 6A:
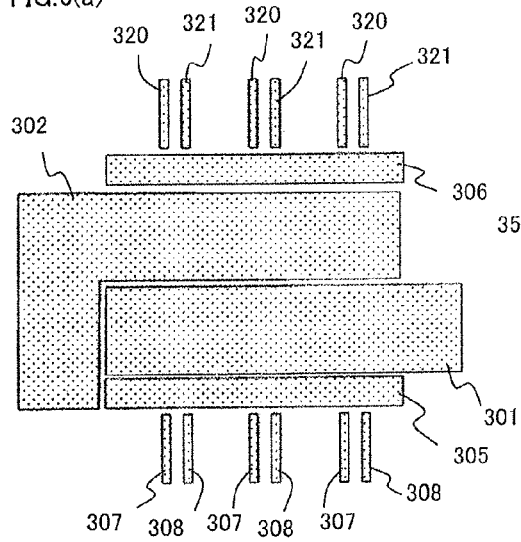
FIGS. 6(a)-(e) are plan views which show the assembly flow of the semiconductor module for electric power of Embodiment 3 of the present invention.
Figure 6D:
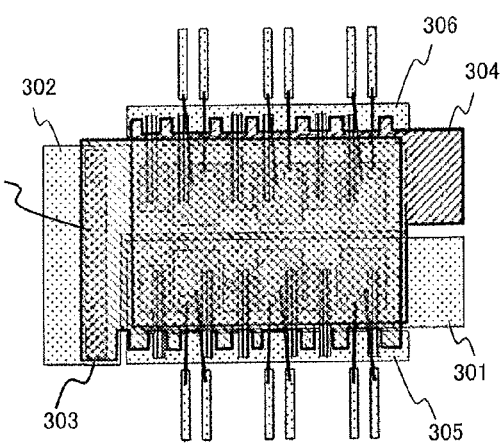
Figure 6B:
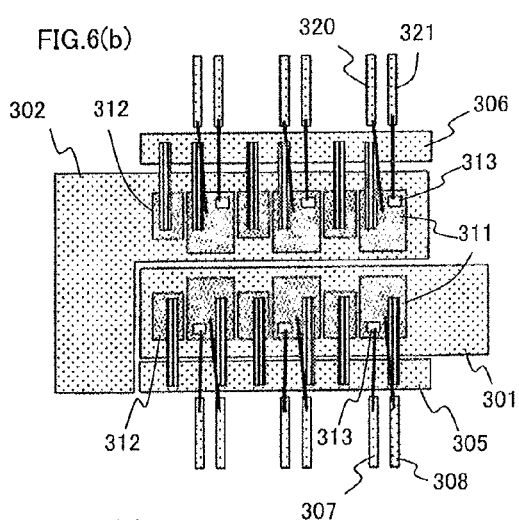
Figure 6E:
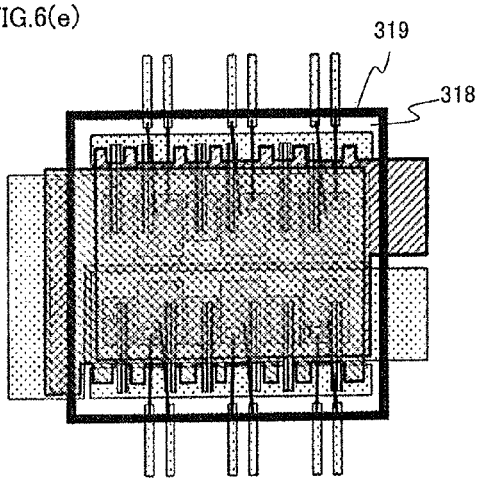
Figure 6C:
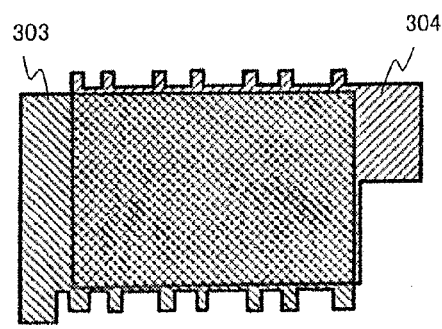

Next, in FIG. 6(c), prepared are the third frame 303 on the positive electrode side which functions as a busbar, and the fourth frame 304 on the negative electrode side. In reality, the shapes of the third frame 303 and the fourth frame 304 are worked, and the insulator 1200 is arranged between those lead frames and allowed to be glued. In this way, formed is a complex such that via the insulator 1200 the third frame 303 and the fourth frame 304 are arranged in parallel.

And, in FIG. 6(d), the complex of the third frame 303 and the fourth frame 304 having been formed in FIG. 6(c) is, above the first frame 301 and the second frame 302, arranged, the feet of the third frame 303 are metal-bonded to the first intermediate frame 305, and the feet of the fourth frame 304 are metal-bonded to the second intermediate frame 306. Moreover at this time, the foot of the third frame 303 is metal-bonded at the bonding point 350 to the second frame 302.

After that, in FIG. 6(e), molding is carried out by the insulating resin 318, the whole is sealed with the shape which is regulated with the outer rim 319 of the insulating resin, and thereby fixation of the module is carried out.

Through the assembly flow like this, the semiconductor module for electric power of the present Embodiment 3 is thereby finished.

Figure 5A:
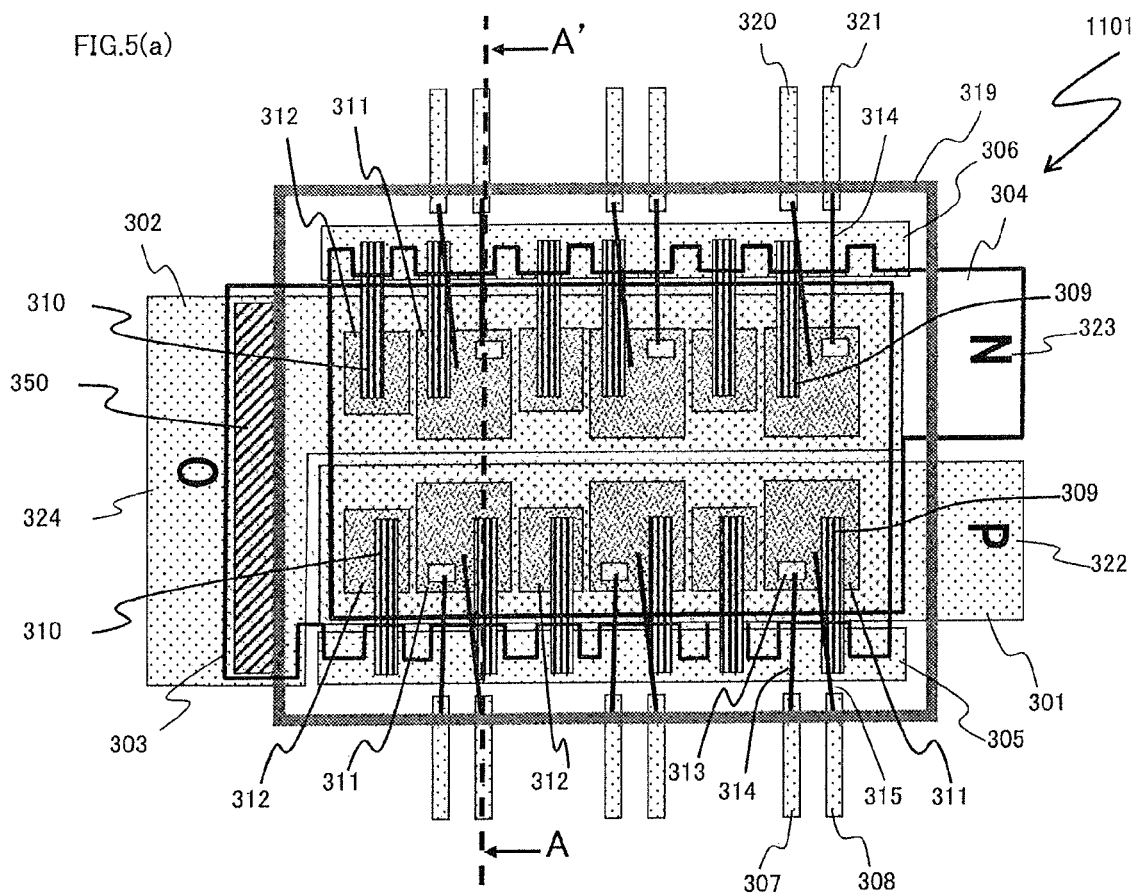
FIG. 5(a) is a plan view of the semiconductor module for electric power in Embodiment 3 of the present invention.
Figure 5B:
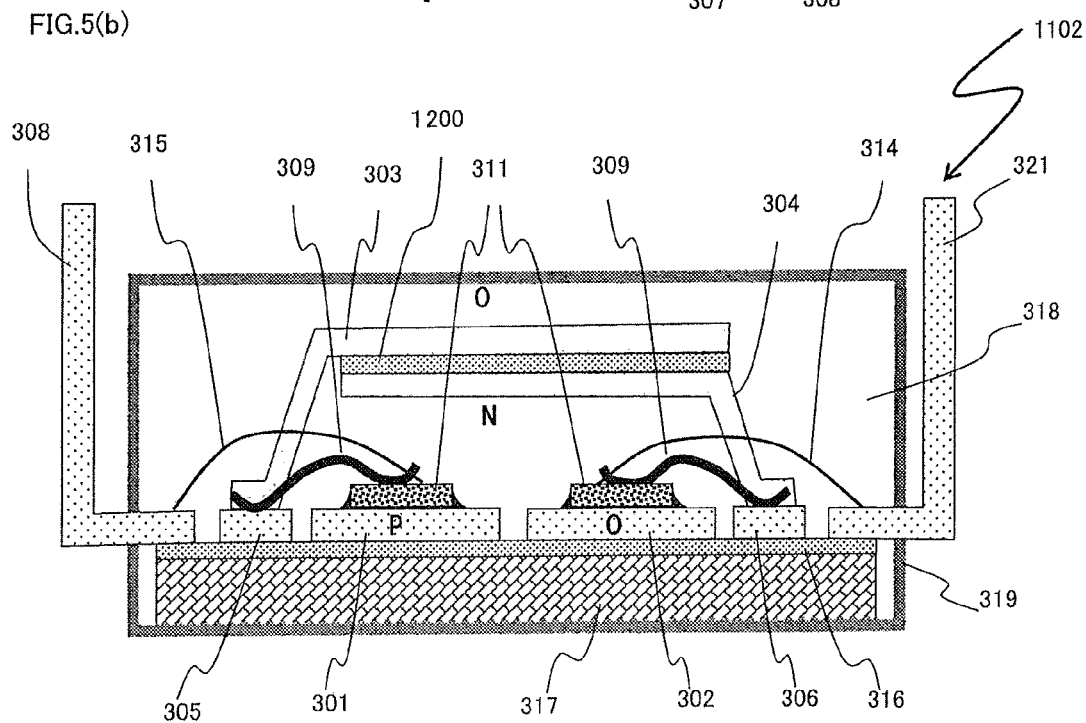
FIG. 5(b) is a section view of the semiconductor module for electric power in Embodiment 3 of the present invention, in A-A' of FIG. 5(a).

Next, using FIG. 5(a) and FIG. 5(b), descriptions are given regarding the configuration of the semiconductor module for electric power of the present Embodiment 3 which is manufactured through the assembly flow shown in FIG. 6(a)-FIG. 6(e).

Gluing by a die-bond material is carried out, and thereby onto the first frame 301 and onto the second frame 302 plural semiconductor chips are mounted. These semiconductor chips are configured with the transistor chips 311 and the diode chips 312.

The first frame 301 and the second frame 302 are arranged on the heat radiating plate 317 via the insulator 316. It is good that the heat radiating plate 317 is configured with a material like Cu or Al such that the heat conduction rate is large. It is good that the insulator 316 is configured with a material such that the heat conduction property is good, and the electric insulation property is good as well.

For the whole of the wirings, molding is carried out by the insulating resin 318, and by the outer rim 319 of the insulating resin the shape of the module is defined.

Additionally, the configuration of the semiconductor module for electric power of the present Embodiment 3 which uses an SiC-MOSFET as the transistor chip 311 corresponds to an example of the semiconductor module for electric power of the present invention. Moreover, the transistor chips 311 and the diode chips 312 mounted onto the first frame 301 correspond, respectively, to examples of the first transistors and the first diodes of the present invention. Moreover, the transistor chips 311 and the diode chips 312 mounted onto the second frame 302 correspond, respectively, to examples of the second transistors and the second diodes of the present invention. Moreover, the insulator 316 corresponds to an example of the first insulator.

At the outsides of the first frame 301 and the second frame 302, the first intermediate frame 305 and the second intermediate frame 306 which are narrow in width compared with these frames are arranged, with the first intermediate frame 305 at the side near to the first frame 301 roughly in parallel, and the second intermediate frame 306 at the side near to the second frame 302 roughly in parallel.

Connection is carried out from the source electrode or the emitter electrode of the transistor chip 311 on the first frame 301 to the first intermediate frame 305 with the connecting line 309 of metal, and connection is carried out from the anode electrode of the diode chip 312 on the first frame 301 to the first intermediate frame 305 with the connecting line 310 of metal. To the places on the first intermediate frame 305, where the connecting lines 309, 310 of metal do not exist, the feet of the third frame 303 which is arranged above the first frame 301 are connected.

Connection is carried out from the source electrode or the emitter electrode of the transistor chip 311 on the second frame 302 to the second intermediate frame 306 with the connecting line 309 of metal, and connection is carried out from the anode electrode of the diode chip 312 on the second frame 302 to the second intermediate frame 306 with the connecting line 310 of metal. To the places on the second intermediate frame 306, where the connecting lines 309, 310 of metal do not exist, the feet of the fourth frame 304 which is arranged above the second frame 302 are connected.

Additionally, the connecting lines 309 and 310 of metal which connect the transistor chip 311 and the diode chip 312 on the first frame 301, and the first intermediate frame 305 correspond to examples of the first connecting lines of metal of the present invention. Moreover, the connecting lines 309 and 310 of metal which connect the transistor chip 311 and the diode chip 312 on the second frame 302, and the second intermediate frame 306 correspond to examples of the second connecting lines of metal of the present invention.

Further, it is desirable that the third frame 303 is arranged so as to overlap with the fourth frame 304 in the up-and-down direction and, with the insulator 1200 being sandwiched between those and thereby allowing the closest-coming structure also with insulation-voltage-resistance insured, is configured to be placed above the transistor chips 311 and the diode chips 312, which are arranged on the first frame 301 and the second frame 302.

Additionally, the insulator 1200 corresponds to an example of the second insulator.

At this point, since the insulator 1200 is provided with the object of insuring the distance between the third frame 303 and the fourth frame 304, in case there is another means, which insures the distance between these frames, then it is not necessary to provide the insulator 1200, and an alternative means may be used to insure the distance between these frames.

It is desirable that the insulator 1200 between the third frame 303 and the fourth frame 304 is configured with an insulating resin or a ceramic.

Moreover, the thickness of the insulator 1200 is appropriately set with the trade-off relation between the voltage-resistance and the electric characteristics. As the distance between the frames comes near, the inductance reduces, but the voltage-resistance decreases. As the distance between the frames comes apart, the voltage-resistance is able to be improved, but the effect of magnetic fields cancelling decreases and the inductance becomes large.

In a case where the insulator 1200 is configured with a ceramic, it is appropriate that the maximum electric field strength is set to be about 1 MV/cm or less. In order to insure a resistance-electric-voltage of 1 kV a thickness of 10 μm becomes necessary. In reality, impressing an electric field of this or more does not imply immediate destruction, but setting of about 1 MV/cm or less is preferable in case insurance of a life of 20 years or more in a high temperature environment of 300° C. or more is intended.

As for the thickness of the insulator 1200 in reality, which will depend on the resistance-electric-voltage, setting of (resistance-electric-voltage/(1 MV/cm)) as the setting for the thinnest is desirable. Setting is carried out like this and thereby the inductance reducing effect is able to be exhibited to the maximum. Since, as a resistance-electric-voltage necessary for a semiconductor module for electric power in reality, a resistance-electric-voltage of 1 kV or more at the lowest becomes necessary, as for the configuration for the thinnest of the thickness of the insulator 1200 the thickness becomes 10 μm or more.

Moreover, as for the upper limit of the thickness of the insulator 1200, setting of about 1 mm or less is desirable. Setting is carried out like this and thereby the inductance reducing effect becomes capable of being allowed to be exhibited.

Figure 7:
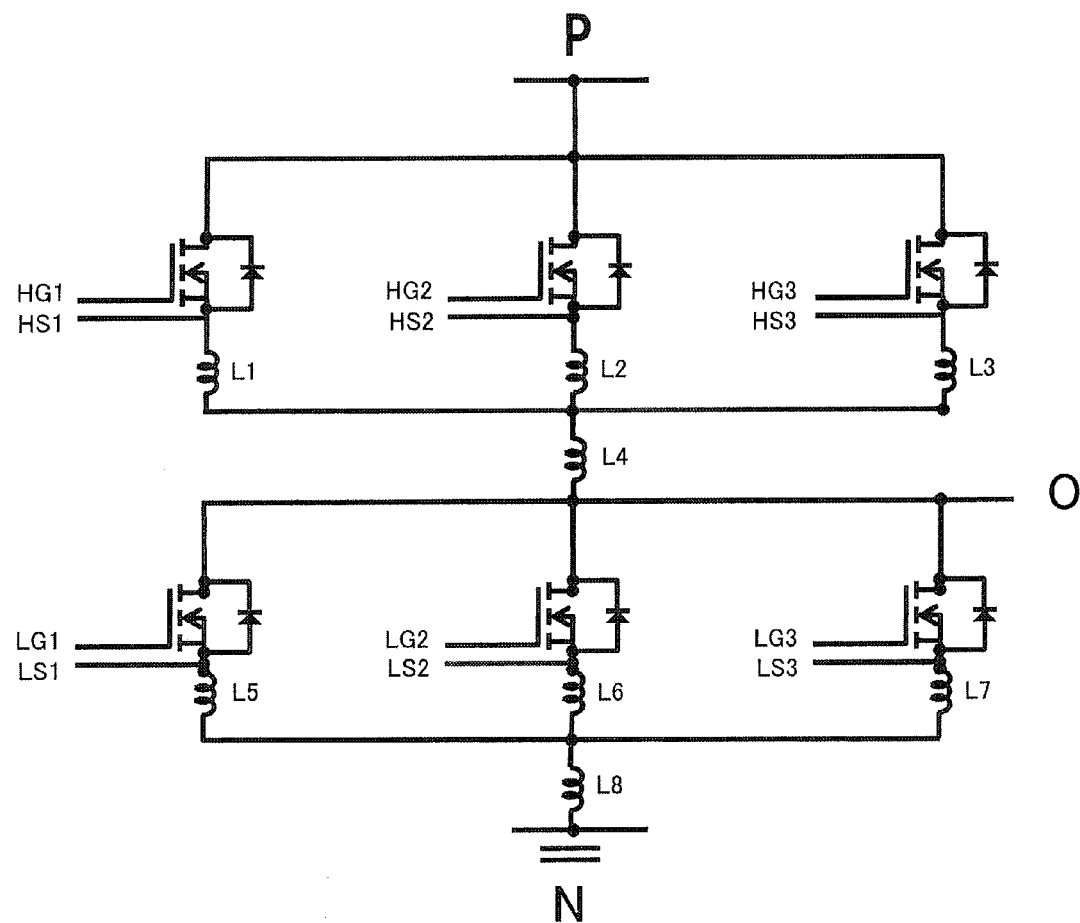
FIG. 7 is an equivalency circuit diagram of the semiconductor module for electric power in Embodiment 3 of the present invention.

In FIG. 7, an equivalency circuit diagram of the semiconductor module for electric power in the present Embodiment 3 is shown.

L1, L2, L3, L5, L6 and L7 shown in FIG. 7 show the inductances between the transistor chips 311 and, the first intermediate frame 305 and the second intermediate frame 306. L4 and L8 become the wiring inductances the third frame 303 and the fourth frame 304 have, respectively. Busbars wide in width are used, these are thereby capable of being reduced but, as shown in FIG. 5(a), the P (electric source) terminal and the N (ground) terminal are arranged at the side of the same side face within the side faces of the semiconductor module for electric power, the O (output) terminal is arranged at the side of the side face on the facing opposite side, the orientation of the electric current which flows in the third frame 303 and the orientation of the electric current which flows in the fourth frame 304 are configured to become opposite orientations, the inductance reducing effect by the effect of magnetic fields cancelling is thereby used and further reducing of the wiring inductance is able to be realized, so that, in actuality, L4 and L8 become capable of being reduced to a negligible extent.

As a result thereof, as for the inductances in reality only the inductances (L1, L2, L3, L5, L6 and L7) of the wirings which join the source electrodes and the intermediate leads become the substantial inductance values but, since the electric current quantity per one chip is small in comparison to the electric current quantity of the whole, the electric characteristics of the whole of the semiconductor module for electric power are able to realize an excellent operation.

Like this, by being able to reduce L4 and L8 to a negligible extent in actuality, able to be suppressed are generation of surge electric voltage at the time of switching of the transistor being OFF when a large electric current is allowed to flow, a defect on gate driving such as a gate oscillation or the like at the time of the switching being ON/OFF. This is a characterization of the semiconductor module for electric power of the present Embodiment 3.

Moreover, since in the position relation of the first frame 301, the second frame 302, the third frame 303 and the fourth frame 304, there is a more preferable configuration, descriptions are given regarding the configuration thereof in the following.

Intrinsically, the position relation of the up-and-down of the third frame 303 and the fourth frame 304 which are positioned over the first frame 301 and the second frame 302 gives no influence on the reducing effect of L4 and L8 of the inductances described in the above-mentioned. Therefore, in case the distance between the first frame 301 and the second frame 302, and the third frame 303 and the fourth frame 304 is able to be sufficiently insured, then the arrangement configuration of the up-and-down of the third frame 303 and the fourth frame 304 is capable of being any configuration. But, if the feet of the third frame 303 and the fourth frame 304 are gradually shortened, then there is a configuration such that a bad influence comes out in the arrangement configuration of the up-and-down of the third frame 303 and the fourth frame 304.

In case the feet of the third frame 303 and the fourth frame 304 are able to be shortened, then further reduction of the inductance is able to be realized, which thereupon leads to further advantageous structure since these frames come to function also as heat radiating plates.

In order to allow this effect to be effectively exhibited, that is to say, in a case where the feet of the third frame 303 and the fourth frame 304 are gradually shortened, desirable is a configuration such that at the upper side of the fourth frame 304 the third frame 303 is arranged. Since the fourth frame 304 is grounded, by the electric potential fixing, the structure is capable of being allowed to be strong against noise.

But, provided that, in a case where the structure is allowed to be such that the third frame 303 is arranged at the lower side of the fourth frame and that the third frame 303 is arranged immediately above the first frame 301 and the second frame 302, the feet of the third frame 303 and the fourth frame 304 are gradually shortened, the configuration gets to be such that a bad influence is given.

Specifically, a gate input signal of the transistor chip 311 on the low-side side on the second frame 302 becomes a cause of engendering noise. This is generated, by the third frame 303 and gate wiring 314 possessing capacitance coupling, and the electric voltage of the third frame 303 varying in 0V-the electric source electric voltage. More specifically, at the very moment that the transistor chip 311 on the low-side side gets OFF, the electric voltage of the third frame 303 rises up to the electric source electric voltage. This occurs by the electric voltage of the gate wiring being positively pulled up, on that occasion, despite the OFF state of the transistor chip 311 on the low-side side. Particularly, there are many cases where the electric sources of the drivers which drive the transistor chips 311 on the low-side side are allowed to be driven in common and, as a result thereof, the noise resistance property is weak compared with the high-side side since the driver input signal line distances become long. Therefore, also in order to improve the noise resistance property of an element on the low-side side, it is preferable that the busbar immediately above the transistor chips 311 which are installed on the second frame 302 is the fourth frame 304 which is grounded, also from the viewpoint of the noise resistance property.

The connecting line 309 of metal which is used to carry out connection from the source electrode or the emitter electrode of the transistor chip 311 on the first frame 301 to the first intermediate frame 305 is, usually, configured with a plurality of wires of Al, and also tolerates a large electric current.

Nowadays, the configuration is allowed to be with a ribbon of Al or a ribbon of Cu, bonding reliability is thereby improved, and besides further electric current enlarging, high heat radiating property are able to be realized. Moreover, a similar function is capable of being realized even if an Al clip, a Cu clip or a clip composed of other materials is used, in lieu of the connecting line 309 of metal.

Also for the connecting line 310 of metal which is used to carry out connection from the anode electrode of the diode chip 312 to the first intermediate frame 305, the above-mentioned is similarly true.

Moreover, also for the connecting lines 309 and 310 of metal which are used to carry out line-tying of the transistor chip 311 and the diode chip 312 on the second frame 302, and the second intermediate frame 306, the above-mentioned is similarly true.

The electric source terminal part 322 on an extension of the first frame 301 has a function as an electrode, and functions as a P (electric source) terminal.

The ground terminal part 323 on an extension of the fourth frame 304 has a function as an electrode, and functions as an N (ground) terminal.

For the third frame 303 and the second frame 302, line-tying is carried out at the metal bonding point 350 which is arranged at the side reverse to the P terminal and the N terminal, and the output terminal part 324 on an extension of the second frame 302 has a function as an electrode, and functions as an O (output) terminal.

By the configuration like this, the first intermediate frame 305, the second intermediate frame 306, the third frame 303 and the fourth frame 304 are used in combination and, since the space over the semiconductor chips is able to be effectively utilized as a wiring (busbar) arrangement of wide width, further miniaturization of the semiconductor module for electric power is thereby able to be realized, which leads to structure more advantageous to inductance lowering. Because the first frame 301 and the second frame 302 which are installing the semiconductor chips are able to be allowed to come close, the wiring length becomes short and further inductance lowering becomes capable of being realized.

In regards to the gate wirings 314, joining-up between the high-side side gate terminal 307 and the low-side side gate terminal 321, and the gate pads 313 of the transistor chips 311 respectively corresponding thereto is carried out with metal wires.

In regards to the source wirings 315, joining-up between the high-side side source terminal 308 and the low-side side source terminal 320, and the source electrodes of the transistor chips 311 respectively corresponding thereto is carried out with metal wires.

In order to insure the insulation between these frames it is desirable to allow the configuration to be such that, as shown in FIG. 5(b), the insulator 316 is arranged on the heat radiating plate 317 which is arranged at the lower face side, with each frame arranged thereon, and that the molding is carried out by the insulating resin 318 in a manner such that the external form is regulated with the outer rim 319 of the insulating resin.

Not limited to the examples shown here, the number and arrangement of semiconductor chips are, since being determined in arbitrary combination with the electric current rating of the semiconductor module for electric power, not particularly regulated.

For the minimum configuration unit of the semiconductor chip number, only one transistor chip, or the transistor chip and diode chip is the one configuration but, since even if the configuration is like this, there is a requirement of inductance reducing in order to achieve high-speed operation of the device, the effect by applying the configuration of the semiconductor module for electric power of the present Embodiment 3 is large.

Particularly, it is not necessary that the number of transistor chips and the number of diode chips coincide and, even if these numbers do not coincide, the effects of the present Embodiment 3 are exhibited.

By the configuration of the semiconductor module for electric power of the present Embodiment 3, the third frame 303 and the fourth frame 304 which are lead frames wide in width are arranged to be overlapped with the space over the semiconductor elements used, the positive-electrode side busbar is configured with the third frame 303, the negative-electrode side busbar is configured with the fourth frame 304 and thereby the wiring inductance is able to be reduced, so that the module size becomes capable of being miniaturized. Particularly, the insulator 1200 is sandwiched between the positive-electrode side busbar and the negative-electrode side busbar, and thereby able to allow the closest-coming structure also with insulation-voltage-resistance insured and, furthermore, a configuration is adopted which allows, in the respective third frame 303 and fourth frame 304, the electric currents to flow in reverse orientations, so that with an effect of mutual inductance the inductance value on the source electrode side is thereby able to be drastically reduced, which enables more stable driving even if a large electric current is allowed to flow. In other words, in a manner such that induced electric voltages which are generated in the third frame 303 and the fourth frame 304 become in reverse directions with each other, each part is arranged.

As a result thereof, the configuration of the semiconductor module for electric power becomes capable of being allowed to be strong against noise. Moreover, because direct busbar connection to a semiconductor element is not carried out, the configuration is able to be allowed to be such that bonding reliability is remarkably improved.

(Embodiment 4)

In Embodiment 3, the present invention has been described with a module of a resin-sealing-type, but the concept of the present invention is not limited to this and, even if applied to a module formed on a metal insulating substrate, similar effects are obtained. Even with other embodiments, similar effects are obtained.

Figure 8A:
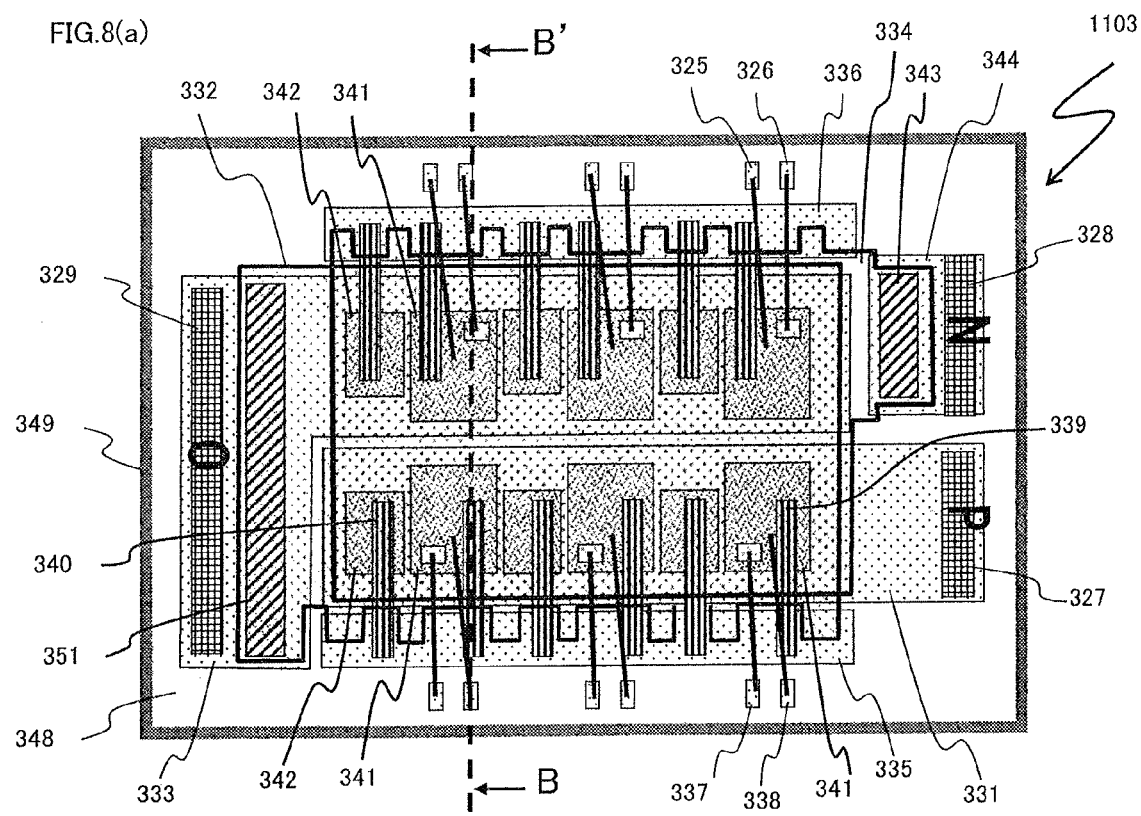
FIG. 8(a) is a plan view of the semiconductor module for electric power in Embodiment 4 of the present invention.

As Embodiment 4 of the present invention, the module configuration 1103 which is a plan view of the semiconductor module for electric power of a metal-insulating-substrate-type is shown in FIG. 8(a).

Figure 8B:
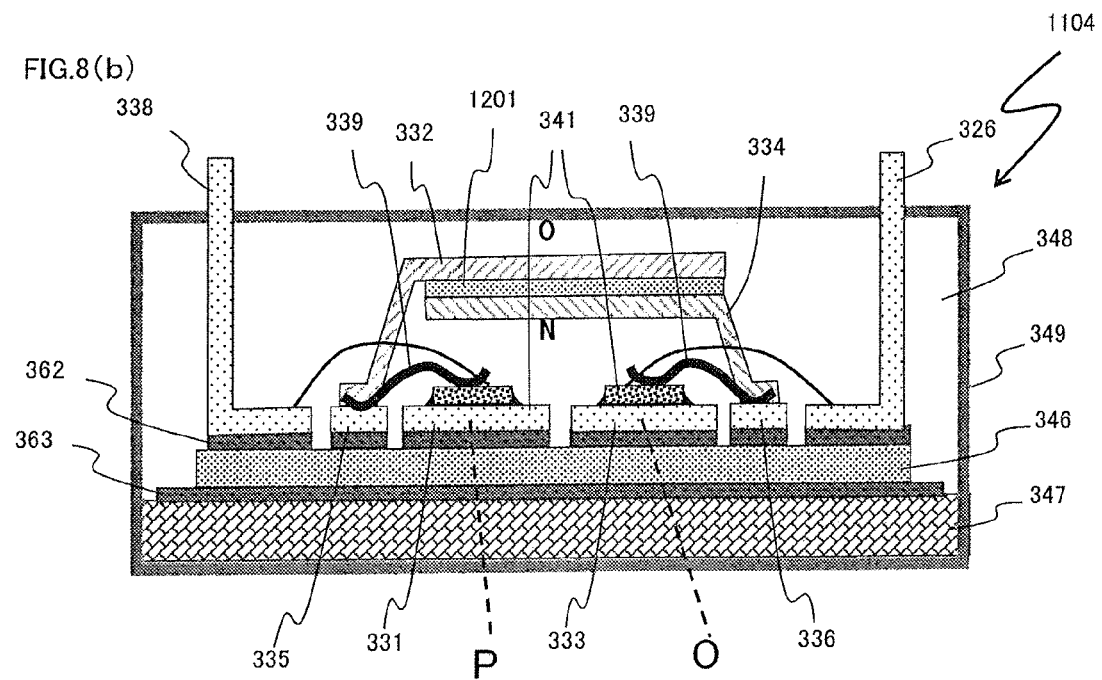
FIG. 8(b) is a section view of the semiconductor module for electric power in Embodiment 4 of the present invention, in B-B' of FIG. 8(a).

Moreover, shown in FIG. 8(b) is the section configuration 1104 of the semiconductor module for electric power of the present Embodiment 4 such that cutting is carried out with B-B' in FIG. 8(a).

Moreover, in FIG. 9(a)-FIG. 9(e), an assembly flow diagram of the semiconductor module for electric power of the present Embodiment 4 is shown. FIG. 9(a)-FIG. 9(e) show, respectively, plan views at the time of assembly of the semiconductor module for electric power of the present Embodiment 4.

Before descriptions are given regarding the configuration of the semiconductor module for electric power of the present Embodiment 4, for a start descriptions are given regarding the assembly process of the semiconductor module for electric power of the present Embodiment 4, using FIG. 9(a)-FIG. 9(e).

Figure 9A:
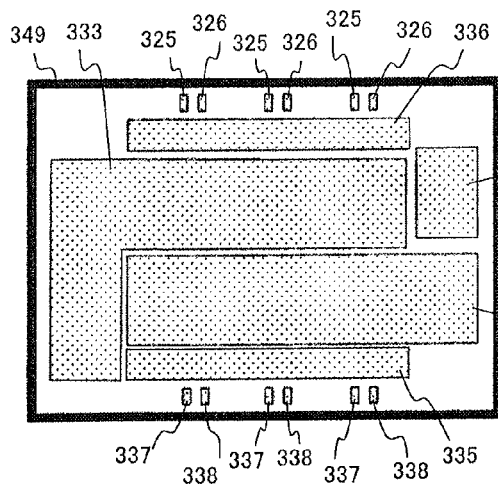
FIGS. 9(a)-(e) are plan views which show the assembly flow of the semiconductor module for electric power of Embodiment 4 of the present invention.

FIG. 9(a) is a wiring pattern diagram on the ceramic substrate of groundwork.

Formed on the substrate are the first metal electric-conductor-island 331, the second metal electric-conductor-island 333, the first intermediate metal electric-conductor-island 335, the second intermediate metal electric-conductor-island 336, the island 344 for forming a ground terminal, the high-side side gate terminals 337, the low-side side source terminals 325, the high-side side source terminals 338, the low-side side gate terminals 326, which are the patterns of copper foil.

For the first metal electric-conductor-island 331 and the second metal electric-conductor-island 333, onto the patterns of these semiconductor chips are mounted. Moreover, the high-side side gate terminal 337 and the high-side side source terminal 338 are leads for sending electric signals to a gate pad, a source pad, respectively. Similarly, the low-side side gate terminal 326 and the low-side side source terminal 325 are also patterns, where leads for sending electric signals to a gate pad, a source pad are formed, respectively.

The ceramic substrate where these wiring patterns are formed is being attached to the case 349. The ceramic substrate shown in FIG. 8(b) as the insulator 346 is attached via the gluing layer 363 onto the heat radiating plate 347 and configured, but descriptions are omitted in regards to detailed descriptions of this portion.

Figure 9B:
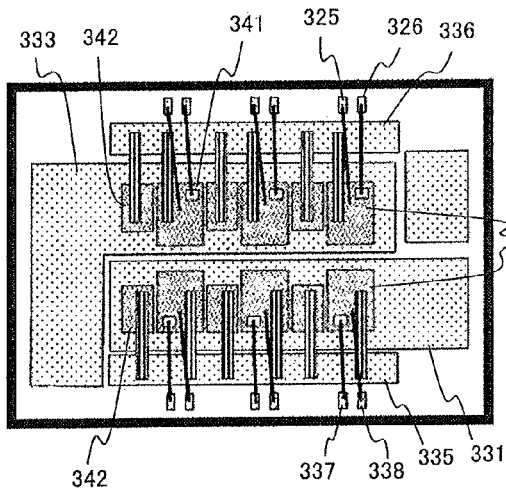

In FIG. 9(b), die-bonded and thereby mounted onto the first metal electric-conductor-island 331 and the second metal electric-conductor-island 333 which are lead frames are the transistor chips 341 and the diode chips 342, which are semiconductor elements. As the transistor chip 341, a transistor like an IGBT or an SiC-MOSFET is mounted. At this time, connected to the first metal electric-conductor-island 331 and the second metal electric-conductor-island 333 is the drain electrode or the collector electrode of the transistor chip 341, which is mounted on the first metal electric-conductor-island 331 and the second metal electric-conductor-island 333, and also connected to the first metal electric-conductor-island 331 and the second metal electric-conductor-island 333 is the cathode electrode of the diode chip 342, which is mounted on the first metal electric-conductor-island 331 and the second metal electric-conductor-island 333.

In the semiconductor module for electric power of the present Embodiment 4, shown is an example such that, on one arm, three transistor chips 341 like an IGBT or an SiC-MOSFET and three diode chips 342 are alternately arranged.

After that, the source electrode or the emitter electrode of the transistor chip 341 which has been mounted on the first metal electric-conductor-island 331 is wire-connected to the first intermediate metal electric-conductor-island 335, and the source electrode or the emitter electrode of the transistor chip 341 which has been mounted on the second metal electric-conductor-island 333 is wire-connected to the second intermediate metal electric-conductor-island 336.

Further, the gate pad of the transistor chip 341 which has been mounted on the first metal electric-conductor-island 331 and the gate terminal 337 on the high-side side of the lead frame are wire-connected, and the source pad of the transistor chip 341 and the source terminal 338 on the high-side side of the lead frame are wire-connected. Similarly, the gate pad of the transistor chip 341 which has been mounted on the second metal electric-conductor-island 333 and the gate terminal 326 on the low-side side of the lead frame are wire-connected, and the source pad of the transistor chip 341 and the source terminal 325 on the low-side side of the lead frame are wire-connected.

Figure 9C:
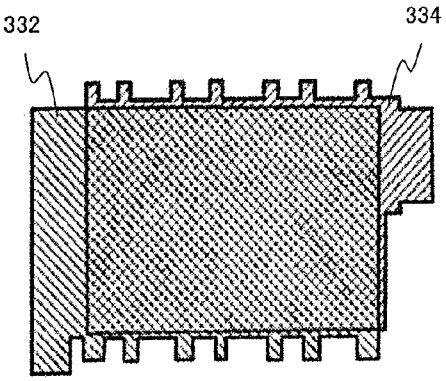

Next, in FIG. 9(c), prepared are the fifth frame 332 on the positive electrode side which functions as a busbar, and the sixth frame 334 on the negative electrode side. In reality, the shapes of the fifth frame 332 and the sixth frame 334 are worked, and the insulator 1201 is arranged between those lead frames and allowed to be glued. In this way, formed is a complex such that via the insulator 1201 the fifth frame 332 and the sixth frame 334 are arranged in parallel.

Figure 9D:
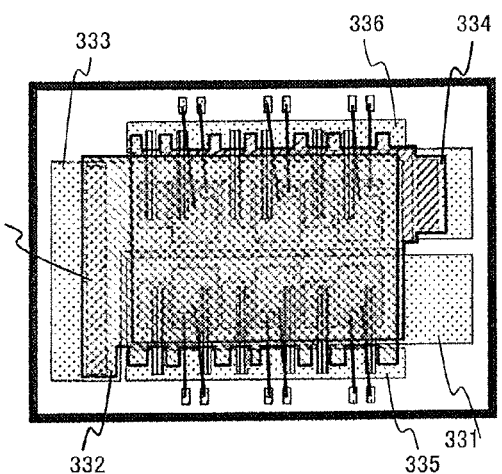

And, in FIG. 9(d), the complex of the fifth frame 332 and the sixth frame 334 having been formed in FIG. 9(c) is, above the first metal electric-conductor-island 331 and the second metal electric-conductor-island 333, arranged, the feet of the fifth frame 332 are metal-bonded to the first intermediate metal electric-conductor-island 335, and the feet of the sixth frame 334 are metal-bonded to the second intermediate metal electric-conductor-island 336. Moreover at this time, the foot of the fifth frame 332 is metal-bonded at the bonding point 351 to the second metal electric-conductor-island 333.

Figure 9E:
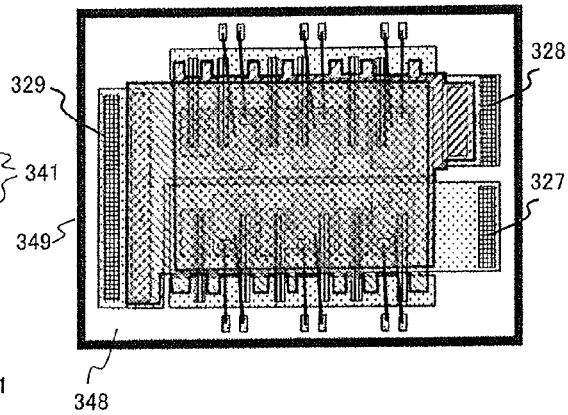

After that, in FIG. 9(e), the electric source terminal 327, the ground terminal 328 and the output terminal 329 are formed. At last, the silicone gel 348 is injected into the case 349 and thereby insulating strength is allowed to be stable.

Through the assembly flow like this, the semiconductor module for electric power of the present Embodiment 4 is thereby finished.

Next, using FIG. 8(a) and FIG. 8(b), descriptions are given regarding the configuration of the semiconductor module for electric power of the present Embodiment 4 which is manufactured through the assembly flow shown in FIG. 9(a)-FIG. 9(e).

The insulator 346 is configured with a ceramic substrate. For example, an aluminum nitride (AlN) substrate or a silicon nitride (SiN) substrate is most suitable and, alternatively, one like an alumina ($Al_2O_3$) substrate is also often used, so that a thick metal wiring which can allow a large electric current to flow in the surface thereof is formed.

As shown in FIG. 8(a), at the outsides of the first metal electric-conductor-island 331 and the second metal electric-conductor-island 333 which are arranged roughly in parallel with each other, the first intermediate metal electric-conductor-island 335 and the second intermediate metal electric-conductor-island 336 which are narrow in width compared with these islands are arranged, with the first intermediate metal electric-conductor-island 335 at the side near to the first metal electric-conductor-island 331 roughly in parallel, and the second intermediate metal electric-conductor-island 336 at the side near to the second metal electric-conductor-island 333 roughly in parallel.

Gluing by a die-bond material is carried out, and thereby onto the first metal electric-conductor-island 331 and onto the second metal electric-conductor-island 333 plural semiconductor chips are mounted. These semiconductor chips are configured with the transistor chips 341 and the diode chips 342.

The first metal electric-conductor-island 331 and the second metal electric-conductor-island 333 are arranged on the heat radiating plate 347 via the insulator 346. The first metal electric-conductor-island 331 and the second metal electric-conductor-island 333 are fixed to the insulator 346 by the gluing layer 362. It is good that the heat radiating plate 347 is configured with a material like Cu or Al such that the heat conduction rate is large. The insulator 346 is fixed to the heat radiating plate 347 by the gluing layer 363. It is good that the insulator 346 is configured with a material such that the heat conduction property is good, and the electric insulation property is good as well.

Additionally, the configuration of the semiconductor module for electric power of the present Embodiment 4 which uses an SiC-MOSFET as the transistor chip 341 corresponds to an example of the semiconductor module for electric power of the present invention. Moreover, the transistor chips 341 and the diode chips 342 mounted onto the first metal electric-conductor-island 331 correspond, respectively, to examples of the first transistors and the first diodes of the present invention. Moreover, the transistor chips 341 and the diode chips 342 mounted onto the second metal electric-conductor-island 333 correspond, respectively, to examples of the second transistors and the second diodes of the present invention. Moreover, the insulator 346 corresponds to an example of the first insulator.

The whole of the semiconductor module for electric power of the present Embodiment 4 is, with the external form being decided by the case 349, filled by the high heat-resistance silicone gel 348 or the like, and the resistance-electric-voltage and the like are insured.

Connection is carried out from the source electrode or the emitter electrode of the transistor chip 341 on the first metal electric-conductor-island 331 to the first intermediate metal electric-conductor-island 335 with the connecting line 339 of metal, and connection is carried out from the anode electrode of the diode chip 342 on the first metal electric-conductor-island 331 to the first intermediate metal electric-conductor-island 335 with the connecting line 340 of metal. To the places on the first intermediate metal electric-conductor-island 335, where the connecting lines 339, 340 of metal do not exist, the feet of the fifth frame 332 which is arranged above the first metal electric-conductor-island 331 are connected.

Connection is carried out from the source electrode or the emitter electrode of the transistor chip 341 on the second metal electric-conductor-island 333 to the second intermediate metal electric-conductor-island 336 with the connecting line 339 of metal, and connection is carried out from the anode electrode of the diode chip 342 on the second metal electric-conductor-island 333 to the second intermediate metal electric-conductor-island 336 with the connecting line 340 of metal. To the places on the second intermediate metal electric-conductor-island 336, where the connecting lines 339, 340 of metal do not exist, the feet of the sixth frame 334 which is arranged above the second metal electric-conductor-island 333 are connected.

Additionally, the connecting lines 339 and 340 of metal which connect the transistor chip 341 and the diode chip 342 on the first metal electric-conductor-island 331, and the first intermediate metal electric-conductor-island 335 correspond to examples of the first connecting lines of metal of the present invention. Moreover, the connecting lines 339 and 340 of metal which connect the transistor chip 341 and the diode chip 342 on the second metal electric-conductor-island 333, and the second intermediate metal electric-conductor-island 336 correspond to examples of the second connecting lines of metal of the present invention.

Further, it is desirable that the fifth frame 332 is arranged in a manner such that the insulator 1201 is sandwiched between the sixth frame 334 and itself, and is configured to be placed above the transistor chips 341 and the diode chips 342 which are arranged on the first metal electric-conductor-island 331 and the second metal electric-conductor-island 333.

Additionally, the insulator 1201 corresponds to an example of the second insulator.

It is desirable that the insulator 1201 between the fifth frame 332 and the sixth frame 334 is configured with an insulating resin or a ceramic.

Moreover, since the thickness of the insulator 1201 is appropriately set with the trade-off relation between the voltage-resistance and the electric characteristics as described in Embodiment 3, descriptions of the details are omitted. To exhibit inductance reducing effect, the thickness of the insulator 1201 is set to 10 µm or more, 1 mm or less as also described in Embodiment 3.

The connecting line 339 of metal which is used to carry out connection from the source electrode or the emitter electrode of the transistor chip 341 on the first metal electric-conductor-island 331 to the first intermediate metal electric-conductor-island 335 is, usually, configured with a plurality of wires of Al, and also tolerates a large electric current.

Nowadays, the configuration is allowed to be with a ribbon of Al or a ribbon of Cu, bonding reliability is thereby improved, and besides further electric current enlarging, high heat radiating property are able to be realized. Moreover, a similar function is capable of being realized even if an Al clip, a Cu clip or a clip composed of other materials is used, in lieu of the connecting line 339 of metal.

Also for the connecting line 340 of metal which is used to carry out connection from the anode electrode of the diode chip 342 to the first intermediate metal electric-conductor-island 335, the above-mentioned is similarly true.

Moreover, also for the connecting lines 339, 340 of metal which are used to carry out line-tying of the transistor chip 341 and the diode chip 342 on the second metal electric-conductor-island 333, and the second intermediate metal electric-conductor-island 336, the above-mentioned is similarly true.

The extension portion of the first metal electric-conductor-island 331 has a function as an electrode, and functions as the P (electric source) terminal 327.

The extension portion of the sixth frame 334 has a function as an electrode, and is connected with the N terminal (the ground terminal) 328. At this point it is desirable to allow, with the island 344 for forming a ground terminal (N) having been provided, the sixth frame to here bond with the bonding point 343 and thereby form the terminal.

For the fifth frame 332 and the second metal electric-conductor-island 333, line-tying is carried out at the metal bonding point 351 which is arranged at the side reverse to the P terminal (the electric source terminal) 327 and the N terminal (the ground terminal) 328, and the extension portion of the second metal electric-conductor-island 333 has a function as an electrode, and functions as the O terminal (the output terminal) 329.

By the configuration like this, the first intermediate metal electric-conductor-island 335, the second intermediate metal electric-conductor-island 336, the fifth frame 332 and the sixth frame 334 are used in combination, since the space over the semiconductor chips is able to be utilized as wirings (busbars) of wide width which is able to realize inductance lowering, miniaturization of the semiconductor module for electric power is thereby also able to be realized and, because the arrangements of the first metal electric-conductor-island 331 and the second metal electric-conductor-island 333 which are installing the semiconductor chips are able to be allowed to come close, realization of further inductance lowering becomes capable of being achieved.

Moreover, the size of the semiconductor module for electric power also becomes capable of being allowed to drastically reduce. Therefore, the wiring length also becomes short and the effect is large since inductance lowering can be further contemplated.

In regards to the gate wirings, joining-up between the high-side side gate terminal 337 and the low-side side gate terminal 326, and the gate pads of the transistor chips 341 respectively corresponding thereto is carried out with metal wires.

In regards to the source wirings, joining-up between the high-side side source terminal 338 and the low-side side source terminal 325, and the source electrodes of the transistor chips 341 respectively corresponding thereto is carried out with metal wires.

In a configuration such that the insulator 346 is arranged on the heat radiating plate 347 which is arranged at the lower face side, with each frame arranged thereon, into the case 349 which is regulated with an outer rim the silicone gel 348 or the like is injected to insure insulation, and thereby the semiconductor module for electric power of the present Embodiment 4 is finished.

Not limited to the examples shown here, the number and arrangement of semiconductor chips are, since being determined in arbitrary combination with the electric current rating of the semiconductor module for electric power, not particularly regulated.

For the minimum configuration unit of the semiconductor chip number, only one transistor chip, or the transistor chip and diode chip is the one configuration but, since even if the configuration is like this, there is a requirement of inductance reducing in order to achieve high-speed operation of the device, the effect by applying the configuration of the semiconductor module for electric power of the present Embodiment 4 is large.

Additionally, also in the configuration of the present Embodiment 4, similarly to Embodiment 3, it is not necessary that the number of transistor chips and the number of diode chips coincide.

Additionally, in the conventional configuration shown in FIG. 10, because direct bonding of a busbar and a semiconductor chip is carried out, if there is a temperature distribution among the configuring semiconductor chips, then on the bonding interface large stress is imposed and there has also been a problem that reliability of the device is deteriorated. In more detail, at a portion where the temperature is high the expansion is large and at a portion of a low temperature the expansion is small, so it has been also found out that there occur defects like cracking in a bonding part of a busbar and a semiconductor chip after utilization for a long period of time, and cracking in a die-bond material between a semiconductor chip and a die pad. As a result of various experiments, it has been also found out that linking plural semiconductor chips with one busbar is a configuration which is not preferable on reliability insurance.

By the configuration of the present invention described in each embodiment, because line-tying is able to be realized with a metal bonding between a frame and a frame instead of a bonding between a semiconductor chip and a frame, larger heat, vibration stress are impressed and thereby firm bonding is able to be realized. In regards to bonding of a semiconductor chip and an intermediate frame, in case a wiring for every semiconductor chip is carried out and thereby respective bondings between a semiconductor chip and a frame are able to individually insure reliability even if a temperature distribution among the semiconductor chips is generated, then reliability of the whole is able to be improved. The configuration is allowed to be like this, and thereby it has been found out that the conventional problem described in the above-mentioned is able to be solved.

As having been described in the foregoing, by the configuration of a semiconductor module for electric power of the present invention, even if strong bonding of a semiconductor chip and a busbar which is difficult is not realized, by overlapping together the positive-electrode side busbar and the negative-electrode side busbar wide in width in the space over the semiconductor chips with intermediate frames utilized and thereby adopting a configuration of closest-coming, in comparison to the conventional art, the wiring inductance becomes capable of being drastically reduced. By means of this, a semiconductor module for electric power which is strong against noise as the whole of the module with high reliability becomes capable of being furnished.

As mentioned above, by a semiconductor module for electric power of the present invention, comprised are:

a first frame where plural first transistors and first diodes are arranged;

a second frame where plural second transistors and second diodes are arranged, which is adjacent to the first frame;

a first intermediate frame which is arranged at an outside of the first frame and the second frame, and is adjacent to the first frame;

a second intermediate frame which is arranged at an outside of the first frame and the second frame, and is adjacent to the second frame;

a third frame which is electrically connected to the first intermediate frame, and is arranged above the first frame;

a fourth frame which is electrically connected to the second intermediate frame, and is arranged above the second frame;

an electric source terminal which is provided on an extension of the first frame;

a ground terminal which is provided on an extension of the fourth frame; and an output terminal which is provided on an extension to which the second frame and the third frame are electrically joined, wherein a drain electrode of the first transistor is connected to the first frame, a source electrode of the first transistor and an anode electrode of the first diode are connected to the first intermediate frame with first connecting lines of metal, a drain electrode of the second transistor is connected to the second frame, a source electrode of the second transistor and an anode electrode of the second diode are connected to the second intermediate frame with second connecting lines of metal, in neighborhoods of the first intermediate frame and the second intermediate frame, gate terminals and source terminals are arranged, all the frames are arranged on a heat radiating plate via a first insulator which is configured with a resin-system material, and at least a part of all the frames is covered with a molding resin, a second insulator is sandwiched between the third frame and the fourth frame, and in the third frame and the fourth frame there are portions which overlap each other in an up-and-down direction, and a configuration is characterized to be such that respective electric currents which flow in the third frame and the fourth frame flow in reverse directions with each other.

Moreover, by a semiconductor module for electric power of the present invention, connected to the first intermediate frame is a foot of the third frame, connected to the second intermediate frame is a foot of the fourth frame, the foot of the third frame is arranged between the plural first connecting lines, and the foot of the fourth frame is arranged between the plural second connecting lines.

Moreover, by a semiconductor module for electric power of the present invention, the fourth frame is arranged above the first frame and the second frame, and the third frame is arranged above the fourth frame.

Moreover, by a semiconductor module for electric power of the present invention, the electric source terminal and the ground terminal are arranged at a side of a same side face within side faces of the semiconductor module for electric power, and the output terminal is arranged at a side of a side face on an opposite side with the electric source terminal and the ground terminal, within the side faces of the semiconductor module for electric power.

Moreover, by a semiconductor module for electric power of the present invention, comprised are:

a first metal electric-conductor-island where plural first transistors and first diodes are arranged;

a second metal electric-conductor-island where plural second transistors and second diodes are arranged, which is adjacent to the first metal electric-conductor-island;

a first intermediate metal electric-conductor-island which is arranged at an outside of the first metal electric-conductor-island and the second metal electric-conductor-island, and is adjacent to the first metal electric-conductor-island;

a second intermediate metal electric-conductor-island which is arranged at an outside of the first metal electric-conductor-island and the second metal electric-conductor-island, and is adjacent to the second metal electric-conductor-island;

a fifth frame which is electrically connected to the first intermediate metal electric-conductor-island, and is arranged above the first metal electric-conductor-island;

a sixth frame which is electrically connected to the second intermediate metal electric-conductor-island, and is arranged above the second metal electric-conductor-island;

an electric source terminal which is provided on an extension of the first metal electric-conductor-island;

a ground terminal which is provided on an extension of the sixth frame; and an output terminal which is connected to the second metal electric-conductor-island, where the second metal electric-conductor-island and the fifth frame electrically join, wherein a drain electrode of the first transistor is connected to the first metal electric-conductor-island, a source electrode of the first transistor and an anode electrode of the first diode are connected to the first intermediate metal electric-conductor-island with first connecting lines of metal, a drain electrode of the second transistor is connected to the second metal electric-conductor-island, a source electrode of the second transistor and an anode electrode of the second diode are connected to the second intermediate metal electric-conductor-island with second connecting lines of metal, in neighborhoods of the first intermediate metal electric-conductor-island and the second intermediate metal electric-conductor-island, gate terminals and source terminals are arranged, all the metal electric-conductor-islands are arranged on a heat radiating plate via a first insulator which is configured with a ceramic material, and at least a part of all the metal electric-conductor-islands is covered with a gel-like resin, a second insulator is sandwiched between the fifth frame and the sixth frame, and in the fifth frame and the sixth frame there are portions which overlap each other in an up-and-down direction, and a configuration is characterized to be such that respective electric currents which flow in the fifth frame and the sixth frame flow in reverse directions with each other.

Moreover, by a semiconductor module for electric power of the present invention, connected to the first intermediate metal electric-conductor-island is a foot of the fifth frame, connected to the second intermediate metal electric-conductor-island is a foot of the sixth frame, the foot of the fifth frame is arranged between the plural first connecting lines, and the foot of the sixth frame is arranged between the plural second connecting lines.

Moreover, by a semiconductor module for electric power of the present invention, the fifth frame is arranged above the sixth frame.

Moreover, by a semiconductor module for electric power of the present invention, the first connecting lines and the second connecting lines are configured with ribbons.

Moreover, by a semiconductor module for electric power of the present invention, the first connecting lines and the second connecting lines are configured with clips.

Moreover, by the above-mentioned configuration, the module size is miniaturized and the wiring inductance is able to be reduced, so that a semiconductor module for electric power which is strong against noise is able to be furnished.

INDUSTRIAL APPLICABILITY

A semiconductor module for electric power pertaining to the present invention has an effect of miniaturizing the module size and being able to reduce the wiring inductance, and is useful as a semiconductor module for electric power or the like which is utilized in a case where electric voltage heightening of the electric source electric voltage, electric current enlarging, speed heightening of the device and the like are required.

DESCRIPTION OF THE REFERENCE NUMERALS 1 first frame
2 second frame
3 third frame
4 fourth frame
5 first intermediate frame
6 second intermediate frame
7 high-side side gate terminal
8 high-side side source terminal
9, 10 connecting line of metal
11 transistor chip
12 diode chip
13 gate pad
14 gate wiring
15 source wiring
16 insulator
17 heat radiating plate
18 insulating resin
19 outer rim of the insulating resin
20 low-side side source terminal
21 low-side side gate terminal
22 electric source terminal part (P)
23 ground terminal part (N)
24 output terminal part (O)
25 low-side side source terminal
26 low-side side gate terminal
27 electric source terminal (P)
28 ground terminal (N)
29 output terminal (O)
31 first metal electric-conductor-island
32 fifth frame
33 second metal electric-conductor-island
34 sixth frame
35 first intermediate metal electric-conductor-island
36 second intermediate metal electric-conductor-island
37 high-side side gate terminal
38 high-side side source terminal
39, 40 connecting line of metal
41 transistor chip
42 diode chip
43 bonding point
44 island for forming a ground terminal (N)
46 insulator
47 heat radiating plate
48 silicone gel
49 case
50, 51 bonding point
62, 63 gluing layer
71 positive-electrode side inner-part-electrode of the busbar
72 negative-electrode side inner-part-electrode of the busbar
73 high-side side element group
74 low-side side element group
101 module configuration
102 module section configuration
103 module configuration
104 module section configuration
301 first frame
302 second frame
303 third frame
304 fourth frame
305 first intermediate frame
306 second intermediate frame
307 high-side side gate terminal
308 high-side side source terminal
309, 310 connecting line of metal
311 transistor chip
312 diode chip
313 gate pad
314 gate wiring
315 source wiring
316 insulator
317 heat radiating plate
318 insulating resin
319 outer rim of the insulating resin
320 low-side side source terminal
321 low-side side gate terminal
322 electric source terminal part (P)
323 ground terminal part (N)
324 output terminal part (O)
325 low-side side source terminal
326 low-side side gate terminal
327 electric source terminal (P)
328 ground terminal (N)
329 output terminal (O)
331 first metal electric-conductor-island
332 fifth frame
333 second metal electric-conductor-island
334 sixth frame
335 first intermediate metal electric-conductor-island
336 second intermediate metal electric-conductor-island
337 high-side side gate terminal
338 high-side side source terminal
339, 340 connecting line of metal
341 transistor chip
342 diode chip
343 bonding point
344 island for forming a ground terminal (N)
346 insulator
347 heat radiating plate
348 silicone gel
349 case
350, 351 bonding point
362, 363 gluing layer
1101 module configuration
1102 module section configuration
1103 module configuration
1104 module section configuration
1200, 1201 insulator

The invention claimed is:
1. A semiconductor module for electric power, comprising:
 a first frame where plural first transistors and first diodes are arranged;
 a second frame where plural second transistors and second diodes are arranged;
 a first intermediate frame which is adjacent to the first frame;
 a second intermediate frame which is adjacent to the second frame;
 a third frame which is electrically connected to the first intermediate frame, and is arranged above the first frame;
 a fourth frame which is electrically connected to the second intermediate frame, and is arranged above the second frame;

an electric source terminal which is provided on an extension of the first frame;
a ground terminal which is provided on an extension of the fourth frame; and
an output terminal which is provided on an extension to which the second frame and the third frame are electrically joined, wherein
a drain electrode of the first transistor is connected to the first frame,
a source electrode of the first transistor and an anode electrode of the first diode are connected to the first intermediate frame with first connecting lines of metal,
a drain electrode of the second transistor is connected to the second frame,
a source electrode of the second transistor and an anode electrode of the second diode are connected to the second intermediate frame with second connecting lines of metal,
in neighborhoods of the first transistor and the second transistor, gate terminals and source terminals are arranged,
the first frame, the second frame, the first intermediate frame, the second intermediate frame, the third frame, and the fourth frame are all arranged on a heat radiating plate via an insulator which is configured with a resin-system material, and at least a part of each of the first frame, the second frame, the first intermediate frame, the second intermediate frame, the third frame, and the fourth frame is covered with a molding resin, and
the third frame and the fourth frame are arranged in parallel with each other, and the electric source terminal, the ground terminal and the output terminal are arranged in a manner such that induced electric voltages, which are generated in the third frame and the fourth frame, become in reverse directions with each other.

2. A semiconductor module for electric power according to claim 1, wherein
connected to the first intermediate frame is a foot of the third frame,
connected to the second intermediate frame is a foot of the fourth frame,
the foot of the third frame is arranged between the plural first connecting lines, and
the foot of the fourth frame is arranged between the plural second connecting lines.

3. A semiconductor module for electric power according to claim 1, wherein
the third frame is arranged so as to be placed above the first transistors and the first diodes, and
the fourth frame is arranged so as to be placed above the second transistors and the second diodes.

4. A semiconductor module for electric power according to claim 1, wherein
a gate electrode of the first transistor is arranged at a side opposite to the first intermediate frame, and
a gate electrode of the second transistor is arranged at a side opposite to the second intermediate frame.

5. A semiconductor module for electric power, comprising:
a first metal electric-conductor-island where plural first transistors and first diodes are arranged;
a second metal electric-conductor-island where plural second transistors and second diodes are arranged;
a first intermediate metal electric-conductor-island which is adjacent to the first metal electric-conductor-island;
a second intermediate metal electric-conductor-island which is adjacent to the second metal electric-conductor-island;
a fifth frame which is electrically connected to the first intermediate metal electric-conductor-island, and is arranged above the first metal electric-conductor-island;
a sixth frame which is electrically connected to the second intermediate metal electric-conductor-island, and is arranged above the second metal electric-conductor-island;
an electric source terminal which is provided on an extension of the first metal electric-conductor-island;
a ground terminal which is provided on an extension of the sixth frame; and
an output terminal which is connected to the second metal electric-conductor-island, where the second metal electric-conductor-island and the fifth frame electrically join, wherein
a drain electrode of the first transistor is connected to the first metal electric-conductor-island,
a source electrode of the first transistor and an anode electrode of the first diode are connected to the first intermediate metal electric-conductor-island with first connecting lines of metal,
a drain electrode of the second transistor is connected to the second metal electric-conductor-island,
a source electrode of the second transistor and an anode electrode of the second diode are connected to the second intermediate metal electric-conductor-island with second connecting lines of metal,
in neighborhoods of the first transistor and the second transistor, gate terminals and source terminals are arranged,
the first metal electric-conductor-island, the second metal electric-conductor-island, the first intermediate metal electric-conductor-island, the second intermediate metal electric-conductor-island, the fifth frame, and the sixth frame are all arranged on a heat radiating plate via an insulator which is configured with a ceramic material, and at least a part of each of the first metal electric-conductor-island, the second metal electric-conductor-island, the first intermediate metal electric-conductor-island, the second intermediate metal electric-conductor-island, the fifth frame, and the sixth frame is covered with a gel-like resin, and
the fifth frame and the sixth frame are arranged in parallel with each other, and the electric source terminal, the ground terminal and the output terminal are arranged in a manner such that induced electric voltages, which are generated in the fifth frame and the sixth frame, become in reverse directions with each other.

6. A semiconductor module for electric power according to claim 5, wherein
connected to the first intermediate metal electric-conductor-island is a foot of the fifth frame,
connected to the second intermediate metal electric-conductor-island is a foot of the sixth frame,
the foot of the fifth frame is arranged between the plural first connecting lines, and
the foot of the sixth frame is arranged between the plural second connecting lines.

7. A semiconductor module for electric power according to claim 5, wherein
the fifth frame is arranged so as to be placed above the first transistors and the first diodes, and the sixth frame is arranged so as to be placed above the second transistors and the second diodes.

8. A semiconductor module for electric power according to claim 1, wherein
the first connecting lines and the second connecting lines are configured with ribbons.

9. A semiconductor module for electric power according to claim 1, wherein
the first connecting lines and the second connecting lines are configured with clips.

10. A semiconductor module for electric power according to claim 5, wherein
a gate electrode of the first transistor is arranged at a side opposite to the first intermediate metal electric-conductor-island, and
a gate electrode of the second transistor is arranged at a side opposite to the second intermediate metal electric-conductor-island.

11. A semiconductor module for electric power according to claim 5, wherein
the first connecting lines and the second connecting lines are configured with ribbons.

12. A semiconductor module for electric power according to claim 5, wherein
the first connecting lines and the second connecting lines are configured with clips.

* * * * *